(12) United States Patent
Kim et al.

(10) Patent No.: US 12,707,720 B2
(45) Date of Patent: Aug. 11, 2026

(54) DISPLAY DEVICE

(71) Applicant: Samsung Display Co., LTD., Yongin-si (KR)

(72) Inventors: Ki Hyun Kim, Yongin-si (KR); Young Gil Park, Yongin-si (KR); Won Bong Baek, Yongin-si (KR); Young Uook Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 599 days.

(21) Appl. No.: 18/300,439

(22) Filed: Apr. 14, 2023

(65) Prior Publication Data

US 2024/0021627 A1 Jan. 18, 2024

(30) Foreign Application Priority Data

Jul. 12, 2022 (KR) ........................ 10-2022-0085409

(51) Int. Cl.
*H10D 86/40* (2025.01)
*H10D 86/60* (2025.01)
(Continued)

(52) U.S. Cl.
CPC ........... *H10D 86/60* (2025.01); *H10D 86/441* (2025.01); *H10W 90/00* (2026.01);
(Continued)

(58) Field of Classification Search
CPC .... H10D 86/60; H10D 86/441; H10D 86/411; H01L 24/05; H01L 24/06; H01L 24/13;
(Continued)

(56) References Cited

U.S. PATENT DOCUMENTS 6,370,019 B1 * 4/2002 Matthies ................ H10K 59/18 345/55
9,653,642 B1 * 5/2017 Raring .................. H10D 8/051
(Continued)

FOREIGN PATENT DOCUMENTS

CN 102103284 A * 6/2011 ........... H10D 86/451
EP 3847699 B1 12/2024
(Continued)

OTHER PUBLICATIONS

English Machine Translation of Jeon CN 102 103 284 (Year: 2025).*

*Primary Examiner* — Donald L Raleigh
(74) *Attorney, Agent, or Firm* — CANTOR COLBURN LLP

(57) ABSTRACT

A display device includes a substrate having a first surface in which a light-emitting element is disposed, a second surface, and a first lateral side; a connecting electrode disposed on the first surface; a first insulating layer disposed on the connecting electrode and including a contact hole; a first upper pad electrode electrically connected to the connecting electrode, the first upper pad electrode having a first thickness in an area not overlapping the contact hole and having a second thickness in an area overlapping the contact hole; a second upper pad electrode disposed on the first upper pad electrode and having a substantially flat profile; a lower pad disposed on the second surface of the substrate; and a side wiring electrically connecting the second upper pad electrode and the lower pad, the side wiring surrounding the first surface, the first lateral side, and the second surface of the substrate.

20 Claims, 19 Drawing Sheets

(51) Int. Cl.

| | |
|---|---|
| ***H10W 90/00*** | (2026.01) |
| *H10W 72/20* | (2026.01) |
| *H10W 72/90* | (2026.01) |

(52) U.S. Cl.

CPC ......... *H10D 86/411* (2025.01); *H10W 72/242* (2026.01); *H10W 72/90* (2026.01); *H10W 72/923* (2026.01); *H10W 72/9415* (2026.01); *H10W 72/942* (2026.01); *H10W 72/944* (2026.01); *H10W 72/953* (2026.01); *H10W 90/724* (2026.01); *H10W 90/792* (2026.01)

(58) Field of Classification Search

CPC ....... H01L 25/167; H01L 24/08; H01L 24/16; H01L 2224/05026; H01L 2224/05073; H01L 2224/05563; H01L 2224/05573; H01L 2224/05686; H01L 2224/06181; H01L 2224/08145; H01L 2224/13021; H01L 2224/16225; H01L 2924/0549

See application file for complete search history.

(56) References Cited

U.S. PATENT DOCUMENTS

| | | | | |
|---|---|---|---|---|
| 11,199,883 | B2 | 12/2021 | Oh et al. | |
| 11,927,995 | B2 | 3/2024 | Oh et al. | |
| 2017/0271299 | A1* | 9/2017 | Li | H05K 3/323 |
| 2021/0018964 | A1 | 1/2021 | Oh et al. | |
| 2022/0075432 | A1 | 3/2022 | Oh et al. | |
| 2023/0005962 | A1* | 1/2023 | Lee | H01L 25/0753 |

FOREIGN PATENT DOCUMENTS

| | | | |
|---|---|---|---|
| KR | 10-1596386 | | 2/2016 |
| KR | 20200062635 | A | 6/2020 |
| KR | 20210009489 | A | 1/2021 |
| KR | 20210158844 | A | 12/2021 |

* cited by examiner

10

200: 210, 230, 240a, 240b

PAD1: PD1, PD2, PD3, PD4, PD5
PD1: PD1a, PD1b, PD1c
PD2: PD2a, PD2b, PD2c
PD3: PD3a, PD3b, PD3c
PD4: PD4a, PD4b, PD4c
200: PA1, LNK

DISPLAY DEVICE

CROSS-REFERENCE TO RELATED APPLICATION

This application claims priority to and benefits of Korean Patent Application No. 10-2022-0085409 under 35 U.S.C. § 119, filed on Jul. 12, 2022 in the Korean Intellectual Property Office (KIPO), the entire contents of which are incorporated herein by reference.

BACKGROUND

1. Technical Field

The disclosure relates to a display device capable of decreasing contact resistance between elements.

2. Description of the Related Art

Electronic devices provide images to users, such as a smartphone, a tablet personal computer (PC), a digital camera, a notebook computer, a navigation system, or a smart television (TV), include display devices for displaying images.

A display device includes a display area capable of displaying various colors while operating in units of pixels or subpixels and a bezel area in which wirings for driving the pixels or subpixels are disposed.

Recently, the demand for techniques for reducing the bezel area of a display device to maximize the display area of the display device or for providing a bezel-less display device has increased, and research and development have been conducted on how to form wirings on the sides of a substrate.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Aspects of the disclosure provide a display device capable of improving the contact between pads and side wirings.

Aspects of the disclosure also provide a display device capable of reducing the contact resistance between pads and side wirings.

However, aspects of the disclosure are not restricted or limited to those set forth herein. The above and other aspects of the disclosure will become more apparent to one of ordinary skill in the art to which the disclosure pertains by referencing the detailed description of the disclosure given below.

According to an embodiment of the disclosure, a display device comprise: a substrate having a first surface in which a light-emitting element is disposed, a second surface that is opposite to the first surface, and a first lateral side that extends between the first and second surfaces; a connecting electrode disposed on the first surface of the substrate and electrically connected to the light-emitting element; a first insulating layer disposed on the connecting electrode and including a contact hole exposing the connecting electrode; a first upper pad electrode disposed on the first insulating layer and electrically connected to the connecting electrode, the first upper pad electrode having a first thickness in an area not overlapping the contact hole in a plan view and a second thickness, which is greater than the first thickness, in an area overlapping the contact hole in a plan view; a second upper pad electrode disposed on the first upper pad electrode and having a substantially flat profile; a lower pad disposed on the second surface of the substrate; and a side wiring disposed on the second upper pad electrode and electrically connecting the second upper pad electrode and the lower pad, the side wiring surrounding the first surface, the first lateral side, and the second surface of the substrate.

In an embodiment, the first upper pad electrode may include a first layer, a second layer, and a third layer. The first, second, and third layers of the first upper pad electrode may be sequentially stacked. The first layer of the first upper pad electrode may have a substantially uniform thickness and have a profile bent along the contact hole. The third layer of the first upper pad electrode may have a substantially uniform thickness and a substantially flat profile. The second layer of the first upper pad electrode may be thicker in the area overlapping the contact hole in a plan view than in the area not overlapping the contact hole in a plan view.

In an embodiment, the first and third layers of the first upper pad electrode may include titanium (Ti), and the second layer of the first upper pad electrode may include aluminum (Al).

In an embodiment, the display device may further comprise a third upper pad electrode disposed between the second upper pad electrode and the side wiring and having a substantially flat profile. The third upper pad electrode may include a transparent conductive oxide and be in direct contact with the side wiring.

In an embodiment, the second upper pad electrode may include a first layer, a second layer, and a third layer. The first, second, and third layers of the second upper pad electrode may be sequentially stacked. The first and third layers of the second upper pad electrode may include Ti. The second layer of the second upper pad electrode may include Al. The first, second, and third layers of the second upper pad electrode may have a substantially uniform thickness and a substantially flat profile.

In an embodiment, the first insulating layer may have a bottom surface that is in direct contact with the connecting electrode, a top surface that is opposite to the bottom surface of the first insulating layer, and lateral sides that extend between the top surface and the bottom surface of the first insulating layer and surround the contact hole. An angle formed by the bottom surface and the lateral sides of the first insulating layer may be about 60° or less.

In an embodiment, the light-emitting element may be a flip chip-type micro-light-emitting diode.

According to an embodiment of the disclosure, a display device comprises a substrate having a first surface in which a light-emitting element is disposed, a second surface that is opposite to the first surface, a first chamfered surface that extends from a side of the first surface, a second chamfered surface that extends from a side of the second surface, and a first lateral side that extends between the first and second chamfered surfaces; a connecting electrode disposed on the first surface of the substrate and electrically connected to the light-emitting element; a first insulating layer disposed on the connecting electrode and including a contact hole exposing the connecting electrode; and a first pad disposed on the first insulating layer and electrically connected to the connecting electrode through the contact hole. The connecting electrode may include a wiring portion electrically connected to the light-emitting element and having a first width in a first direction, and a contact portion overlapping the contact hole in a plan view, being in contact with the first pad, and having a second width, greater than the first width, in the first direction. The contact hole may have a third width, greater than the first width, and less than the second width, in the first direction.

In an embodiment, the wiring portion and the contact portion may extend in a second direction, which intersects the first direction, and the contact hole may extend in the first direction.

In an embodiment, the contact portion may extend over the first surface and be adjacent to a boundary between the first surface and the first chamfered surface.

In an embodiment, the display device may further comprise a second pad disposed on the second surface of the substrate; and a side wiring disposed on the first pad and electrically connecting the first and second pads, the side wiring surrounding the first surface, the first chamfered surface, the first lateral side, the second chamfered surface, and the second surface of the substrate.

According to an embodiment of the disclosure, a display device comprises a substrate having a first surface in which a light-emitting element is disposed, a second surface that is opposite to the first surface, and a first lateral side that extends between the first and second surfaces; a connecting electrode disposed on the first surface of the substrate and electrically connected to the light-emitting element; a first insulating layer disposed on the connecting electrode and including a contact hole exposing the connecting electrode; a first pad disposed on the first insulating layer and electrically connected to the connecting electrode through the contact hole; a second pad disposed on the second surface of the substrate; and a side wiring disposed on the first pad and electrically connecting the first and second pads, the side wiring surrounding the first surface, the first lateral side, and the second surface of the substrate. The side wiring may include a plurality of first particles having a substantially spherical shape or a sphere-like shape, and a plurality of second particles having a substantially rod shape or a rod-like shape and disposed between the first particles.

In an embodiment, the plurality of first particles may have a diameter in a range of about 0.1 μm to about 0.3 μm, and the plurality of second particles may have a length in a range of about 1 μm to about 3 μm.

In an embodiment, the display device may further comprise an overcoat layer surrounding the side wiring. The side wiring may include a metal, and the overcoat layer may include an organic insulating material.

In an embodiment, the plurality of first particles and the plurality of second particles may include silver (Ag).

According to an embodiment of the disclosure a tiled display device comprises a plurality of display devices; and a seam part disposed between the display devices. A first display device of the plurality of display devices may include a substrate having a first surface in which a light-emitting element is disposed, a second surface that is opposite to the first surface, a first chamfered surface that extends from a side of the first surface, a second chamfered surface that extends from a side of the second surface, and a first lateral side that extends between the first and second chamfered surfaces, a top connecting electrode disposed on the first surface of the substrate and electrically connected to the light-emitting element, a first insulating layer disposed on the top connecting electrode and including a contact hole exposing the top connecting electrode, a first upper pad electrode disposed on the first insulating layer, electrically connected to the top connecting electrode, and having a first thickness in an area not overlapping the contact hole in a plan view and a second thickness, which is greater than the first thickness, in an area overlapping the contact hole in a plan view, a second upper pad electrode disposed on the first upper pad electrode and having a substantially flat profile, a lower pad disposed on the second surface of the substrate, and a side wiring disposed on the second upper pad electrode and electrically connecting the second upper pad electrode and the lower pad, the side wiring surrounding the first surface, the first chamfered surface, the first lateral side, the second chamfered surface, and the second surface of the substrate.

In an embodiment, the light-emitting element may be a flip chip-type micro-light-emitting diode.

In an embodiment, the substrate may be formed of glass.

In an embodiment, the first display device may further include a bottom connecting electrode disposed on the second surface of the substrate and a flexible film electrically connected to the bottom connecting electrode through a conductive adhesive member, and the lower pad and the bottom connecting electrode may be electrically connected to each other.

In an embodiment, the plurality of display devices may be arranged in a matrix of M rows and N columns.

According to the aforementioned and other embodiments of the disclosure, the electrical contact between pads and side wirings can be improved.

Also, the contact resistance between the pads and the side wirings can be reduced.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
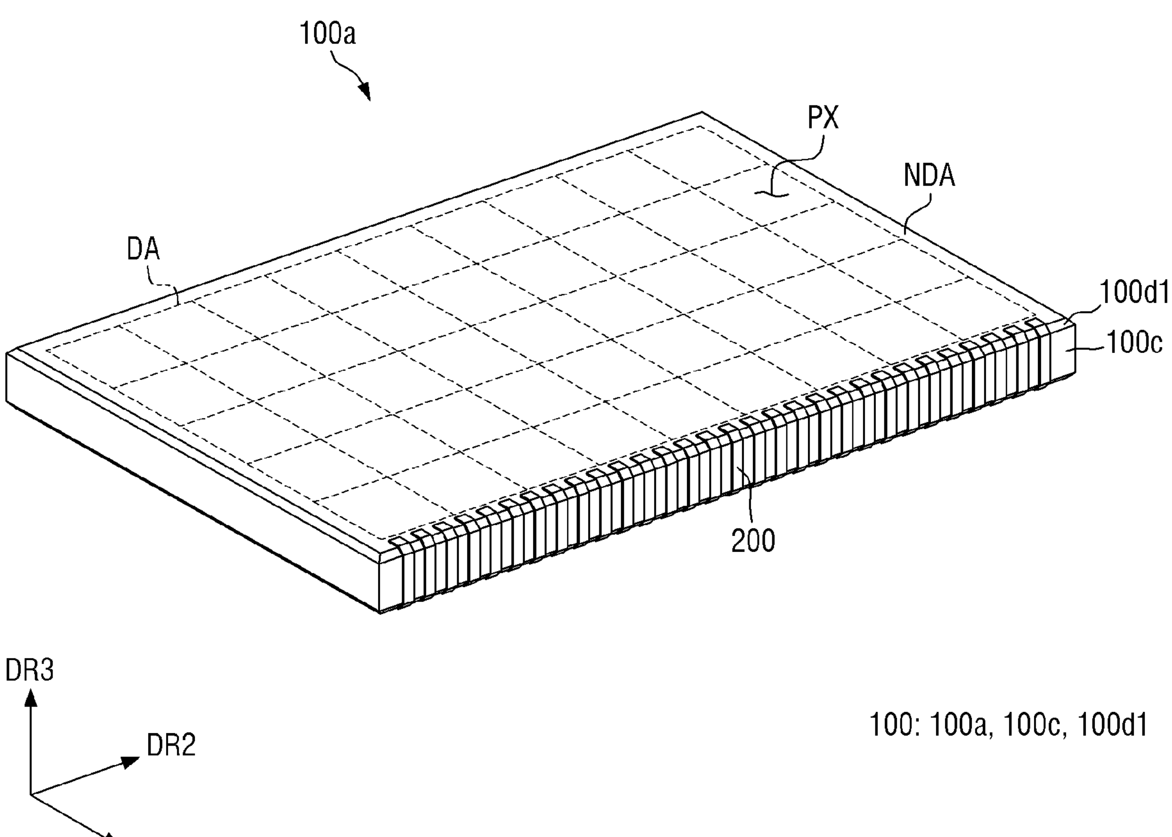
FIG. 1 is a schematic perspective view illustrating a front side of a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, like reference numbers denote like elements.

Although the terms "first," "second," etc. may be used herein to describe various elements, these elements should not be limited by these terms. These terms are used to distinguish one element from another element. Thus, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

Spatially relative terms, such as "beneath," "below," "under," "lower," "above," "upper," "over," "on," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 2:
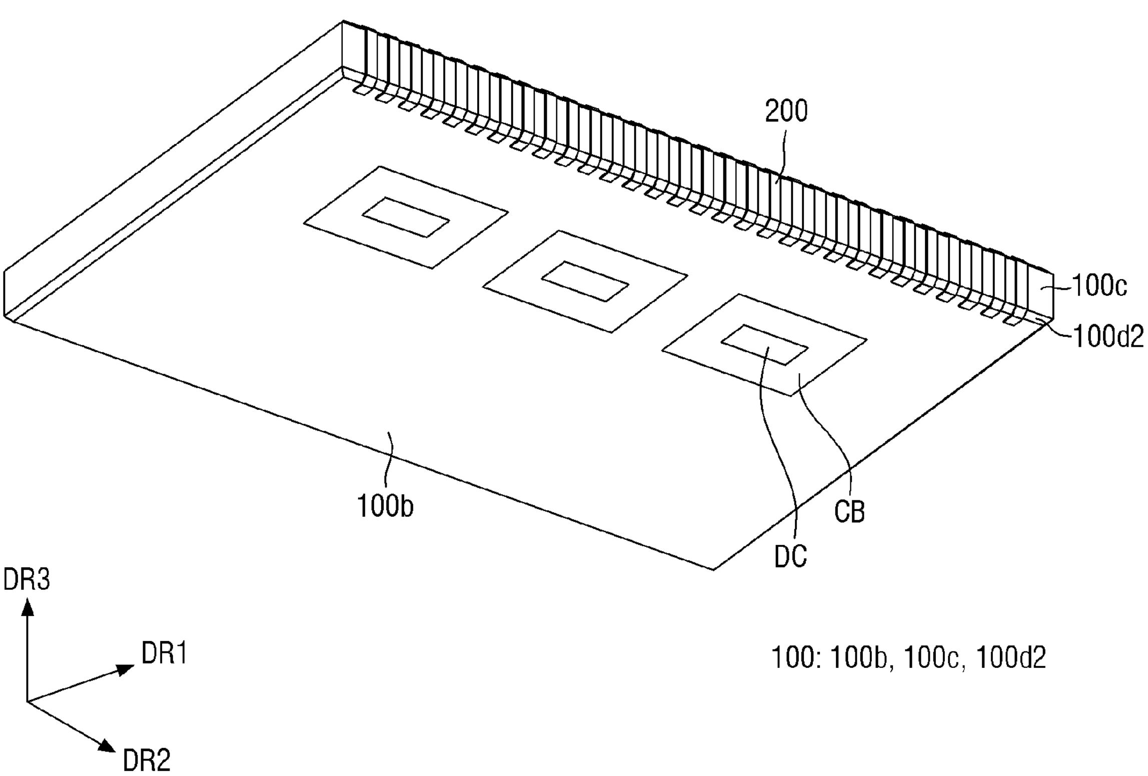
FIG. 2 is a schematic perspective view illustrating a rear side of the display device according to an embodiment of the disclosure.

FIG. 1 is a schematic perspective view illustrating a front side of a display device according to an embodiment of the disclosure. FIG. 2 is a schematic perspective view illustrating a rear side of the display device according to an embodiment of the disclosure.

First, second, and third directions DR1, DR2, and DR3 are defined as illustrated in FIG. 1. Referring to FIG. 1, the first and second directions DR1 and DR2 may be orthogonal (or perpendicular) to each other, the first and third directions DR1 and DR3 may be orthogonal (or perpendicular) to each other, and the second and third directions DR2 and DR3 may be orthogonal (or perpendicular) to each other. The first direction DR1 may be understood as being a vertical direction, the second direction DR2 may be understood as being a horizontal direction, and the third direction DR3 may be understood as being a thickness direction. The term "direction," as used herein, may refer to both sides in each particular direction. For example, a side in a particular direction may be referred to as a first side in the particular direction, and another side (or an opposite side) in the particular direction may be referred to as a second side in the particular direction. Referring to FIG. 1, a side in each direction, indicated by each arrow may be referred to as, but is not limited to, a first side, and the opposite side may be referred to as, but is not limited to, a second side.

For convenience of explanation, a surface of a display device 10 (or each element of the display device 10) that faces a display direction (i.e., a first side in the third direction DR3) may be referred to as a top surface, and an opposite surface of the display device 10 may be referred to as a bottom surface. However, the disclosure is not limited thereto. As another example, the surfaces of the display device 10 may also be referred to as a front side and a rear side or as a first surface and a second surface. When describing the relative location of each element of the display device 10, an element on a first side in the third direction DR3, of another element may also be referred to as being above another element, and an element on a second side in the third direction DR3, of another element may also be referred to as being below another element.

Referring to FIGS. 1 and 2, the display device 10 may be applicable to a mobile electronic device such as a mobile phone, a smartphone, a tablet personal computer (PC), a mobile communication terminal, an electronic notepad, an electronic-book reader, a portable multimedia player (PMP), a navigation system, an ultra-mobile PC (UMPC), or the like. The display device 10 may also be applicable to a television (TV), a notebook computer, a monitor, an electronic billboard, an Internet-of-Things (IoT) device, or the like.

The display device 10 may have a substantially rectangular shape in a plan view. For example, referring to FIG. 1, the display device 10 may have a rectangle-like shape having short sides extending in the first direction DR1 and long sides extending in the second direction DR2. Corners at which the short sides and the long sides of the display device 10 meet each other may be rounded with a curvature (e.g., a predetermined or selectable curvature) or may be right-angled. The planar shape of the display device 10 is not limited thereto, and the display device 10 may be formed in various other shapes such as a polygonal shape other than a rectangular shape, a circular shape, or an elliptical shape in a plan view.

The display device 10 may include a display area DA, which displays an image, and a non-display area NDA, which does not display an image, on a surface (hereinafter, the top surface) thereof in the third direction DR3. For example, the non-display area NDA may be disposed on at least a part of the top surface of the display device 10, both sides (hereinafter, the lateral sides), in the second direction DR2, of the display device 10, both sides, in the first direction DR1, and the other surface (hereinafter, the bottom surface), in the third direction DR3, of the display device 10, but the disclosure is not limited thereto. In some embodiments, the non-display area NDA may be disposed to surround the edges of the display area DA, but the disclosure is not limited thereto. The display area DA and the non-display area NDA of the display device 10 may also be applicable to a substrate 100 that will be described below in detail.

The display device 10 may include the substrate 100, pixels PX, side wirings 200, and a driving part, and the driving part may include circuit boards CB and driving circuits (or display driving circuit) DC.

The substrate 100 may function as a base of the display device 10. In some embodiments, the substrate 100 may be a rigid substrate and may include glass, but the disclosure is not limited thereto. As another example, the substrate 100 may be a flexible substrate and may include polyimide. For convenience of explanation, the substrate 100 will hereinafter be described as being a rigid substrate including glass.

The substrate 100 may have a three-dimensional (3D) shape similar to a rectangular parallelepiped having curved or bent corners. For example, the substrate 100 may have a 3D shape similar to a rectangular parallelepiped, and top and bottom surfaces of the substrate 100 may have curved or bent corners. FIGS. 1 and 2 illustrate that chamfered surfaces are formed on both sides, in the first direction DR1, and both sides, in the second direction DR2, of each of the top and bottom surfaces of the substrate 100, but the disclosure is not limited thereto. As another example, the chamfered surfaces may be formed only on one side, in the first or second direction DR1 or DR2, of each of the top and bottom surfaces of the substrate 100. For convenience of explanation, the chamfered surfaces will hereinafter be described as being formed on both sides, in the first direction DR1, and both sides, in the second direction DR2, of each of the top and bottom surfaces of the substrate 100.

The substrate 100 may include a first surface 100*a,* a second surface 100*b,* chamfered surfaces, and lateral sides.

The first surface 100*a* may be the top surface of the substrate 100. The first surface 100*a* may have a rectangular shape having short sides extending in the first direction DR1 and long sides extending in the second direction DR2.

The second surface 100*b* may be opposite to the first surface 100*a* in the third direction DR3. The second surface 100*b* may be the bottom surface of the substrate 100. The second surface 100*b* may have a rectangular shape having short sides extending in the first direction DR1 and long sides extending in the second direction DR2.

Lateral sides of the substrate 100, which are disposed between the first and second surfaces 100*a* and 100*b,* may include both lateral sides, in the first direction DR1, of the substrate 100 and both lateral sides, in the second direction DR2, of the substrate 100. For convenience of explanation, the lateral side on a first side, in the first direction DR1, of the substrate 100 will hereinafter be referred to as a first lateral side 100*c,* the lateral side on a second side, in the first direction DR1, of the substrate 100 will hereinafter be referred to as a second lateral side, the lateral side on a second side, in the second direction DR2, of the substrate 100 will hereinafter be referred to as a third lateral side, and the lateral side on a first side, in the second direction DR2, of the substrate 100 will hereinafter be referred to as a fourth lateral side.

Chamfered surfaces may be disposed between the first surface 100*a* and the lateral sides of the substrate 100 and between the second surface 100*b* and the lateral sides of the substrate 100. Thus, chipping defects in the side wirings 200 may be prevented. Due to the presence of the chamfered surfaces, the bent angle of the side wirings 200 may become gentle, and as a result, chips or cracks can be prevented in the side wirings 200. For convenience of explanation, the chamfered surface between the first surface 100*a* and the first lateral side 100*c* will hereinafter be referred to as a first chamfered surface 100*d*1, the chamfered surface between the second surface 100*b* and the first lateral side 100*c* will hereinafter be referred to as a second chamfered surface 100*d*2, the chamfered surface between the first surface 100*a* and the second lateral side will hereinafter be referred to as a third chamfered surface, the chamfered surface between the second surface 100*b* and the second lateral side will hereinafter be referred to as a fourth chamfered surface, the chamfered surface between the first surface 100*a* and the third lateral side will hereinafter be referred to as a fifth chamfered surface, the chamfered surface between the second surface 100*b* and the third lateral side will hereinafter be referred to as a sixth chamfered surface, the chamfered surface between the first surface 100*a* and the fourth lateral side will hereinafter be referred to as a seventh chamfered surface, and the chamfered surface between the second surface 100*b* and the fourth lateral side will hereinafter be referred to as an eighth chamfered surface.

For example, the first chamfered surface 100*d*1 may extend from a first side, in the first direction DR1, of the first surface 100*a,* the second chamfered surface 100*d*2 may extend from a first side, in the first direction DR1, of the second surface 100*b,* and the first lateral side 100*c* may connect (or extend between) the first and second chamfered surfaces 100*d*1 and 100*d*2. For example, the third chamfered surface may extend from a second side, in the first direction DR1, of the first surface 100*a,* the fourth chamfered surface may extend from a second side, in the first direction DR1, of the second surface 100*b,* and the second lateral side may connect (or extend between) the third and fourth chamfered surfaces. For example, the fifth chamfered surface may extend from the second side, in the first direction DR1, of the first surface 100*a,* the sixth chamfered surface may extend from the second side, in the first direction DR1, of the second surface 100*b,* and the third lateral side may connect (or extend between) the fifth and sixth chamfered surfaces. For example, the seventh chamfered surface may extend from the second side, in the first direction DR1, of the first surface 100*a,* the eighth chamfered surface may extend from the second side, in the first direction DR1, of the second surface 100*b,* and the fourth lateral side may connect (or extend between) the seventh and eighth chamfered surfaces.

The pixels PX may be disposed on the first surface 100*a* of the substrate 100 and may display an image. The pixels PX may be arranged in the first and second directions DR1 and DR2 in a matrix. The structure of the pixels PX is described below in detail.

The side wirings 200 may electrically connect first pads PAD1 (see, e.g., FIG. 7), which are disposed on the first surface 100*a,* and second pads PAD2 (see, e.g., FIG. 8), which are disposed on the second surface 100*b.* The first pads PAD1 may be electrically connected to data lines, which are electrically connected to the pixels PX on the first surface 100*a* of the substrate 100. The side wirings 200 may be spaced apart from one another in the second direction DR2.

The side wirings 200 may be disposed on the first surface 100*a,* the second surface 100*b,* at least two of the chamfered surfaces, and at least one of the lateral sides of the substrate 100. For example, referring to FIGS. 1 and 2, the side wirings 200 may be disposed on the first surface 100*a,* the second surface 100*b,* the first chamfered surface 100*d*1, the second chamfered surface 100*d*2, and the first lateral side 100*c* to electrically connect the first pads PAD1 and the second pads PAD2. The first pads PAD1 may be disposed on the first surface 100*a* on the first side, in the first direction DR1, of the substrate 100, and the second pads PAD2 may be disposed on the second surface 100*b,* on the first side, in the first direction DR1, of the substrate 100. The shape of the side wirings 200 is described below in detail.

In some embodiments, the side wirings 200 may be disposed only on the first side, in the first direction DR1, of the substrate 100, but the disclosure is not limited thereto. For example, the side wirings 200 may also be disposed on the second side, in the first direction DR1, the substrate 100, on the first side, in the second direction DR2, of the substrate 100, and/or on the second side, in the second direction DR2, of the substrate 100. For example, first pads PAD1 (e.g., additional first pads PAD1) may be additionally disposed on the second side, in the first direction DR1, of the substrate 100, on the first side, in the second direction DR2, of the substrate 100, and/or on the second side, in the second direction DR2, of the substrate 100. Second pads PAD2 (e.g., additional second pads PAD2) may also be additionally disposed on the second side, in the first direction DR1, of the substrate 100, on the first side, in the second direction DR2, of the substrate 100, and/or on the second side, in the second direction DR2, of the substrate 100. For convenience of explanation, the side wirings 200 will hereinafter be described as being disposed only on the first side, in the first direction DR1, of the substrate 100.

The circuit boards CB may be disposed on the second surface 100*b* of the substrate 100. The circuit boards CB may be electrically connected to third pads PAD3 (see, e.g., FIG. 8), which are disposed on the second surface 100*b* of the substrate 100, via conductive adhesive members such as anisotropic conductive films. As will be described below, the third pads PAD3 may be electrically connected to the second pads PAD2, and as a result, the circuit boards CB may be electrically connected to the first pads PAD1 via the side wirings 200. The circuit boards CB may be flexible films such as flexible printed circuit boards (FPCBs), printed circuit boards (PCBs), or chip-on-films (COFs).

The driving circuits DC may generate data voltages and may provide the data voltages to the data lines, which extend from the pixels PX, through the circuit boards CB, the third pads PAD3, the second pads PAD2, the side wirings 200, and the first pads PAD1. The driving circuits DC may be formed as integrated circuits (ICs) and may be attached on the circuit boards CB. As another example, the driving circuits DC may be attached (e.g., directly attached) on the second surface 100*b* of the substrate 100 in a chip-on-glass (COG) manner.

As already mentioned above, the first pads PAD1, which are disposed on the first surface 100*a,* and the second pads PAD2, which are disposed on the second surface 100*b* may be electrically connected to each other via the side wirings 200. Thus, as flexible films bent along the sides of the substrate 100 can be omitted, a bezel-less display device 10 with a minimized non-display area NDA can be realized.

The structure of the pixels PX of the display device 10 will hereinafter be described.

Figure 3:
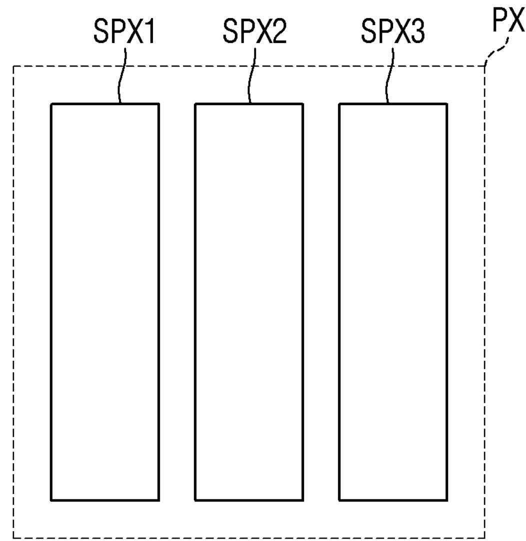
FIG. 3 schematically illustrates the structure of a pixel of the display device according to an embodiment of the disclosure.
Figure 3:
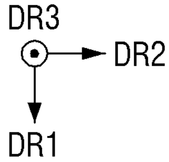
Figure 4:
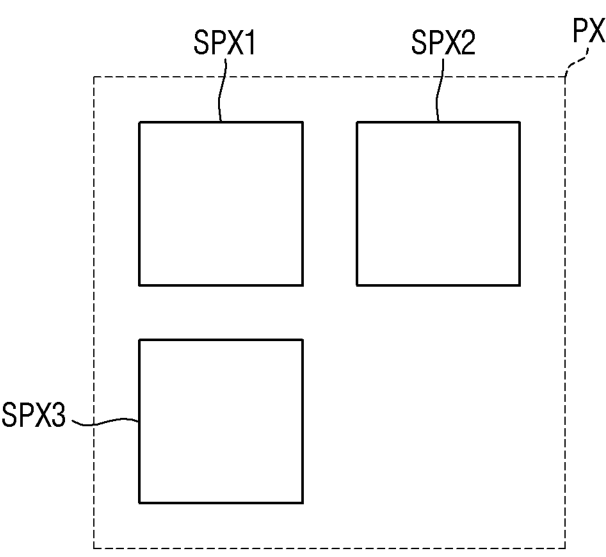
FIG. 4 schematically illustrates the structure of a pixel of a display device according to another embodiment of the disclosure.
Figure 4:
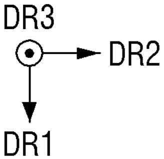
Figure 5:
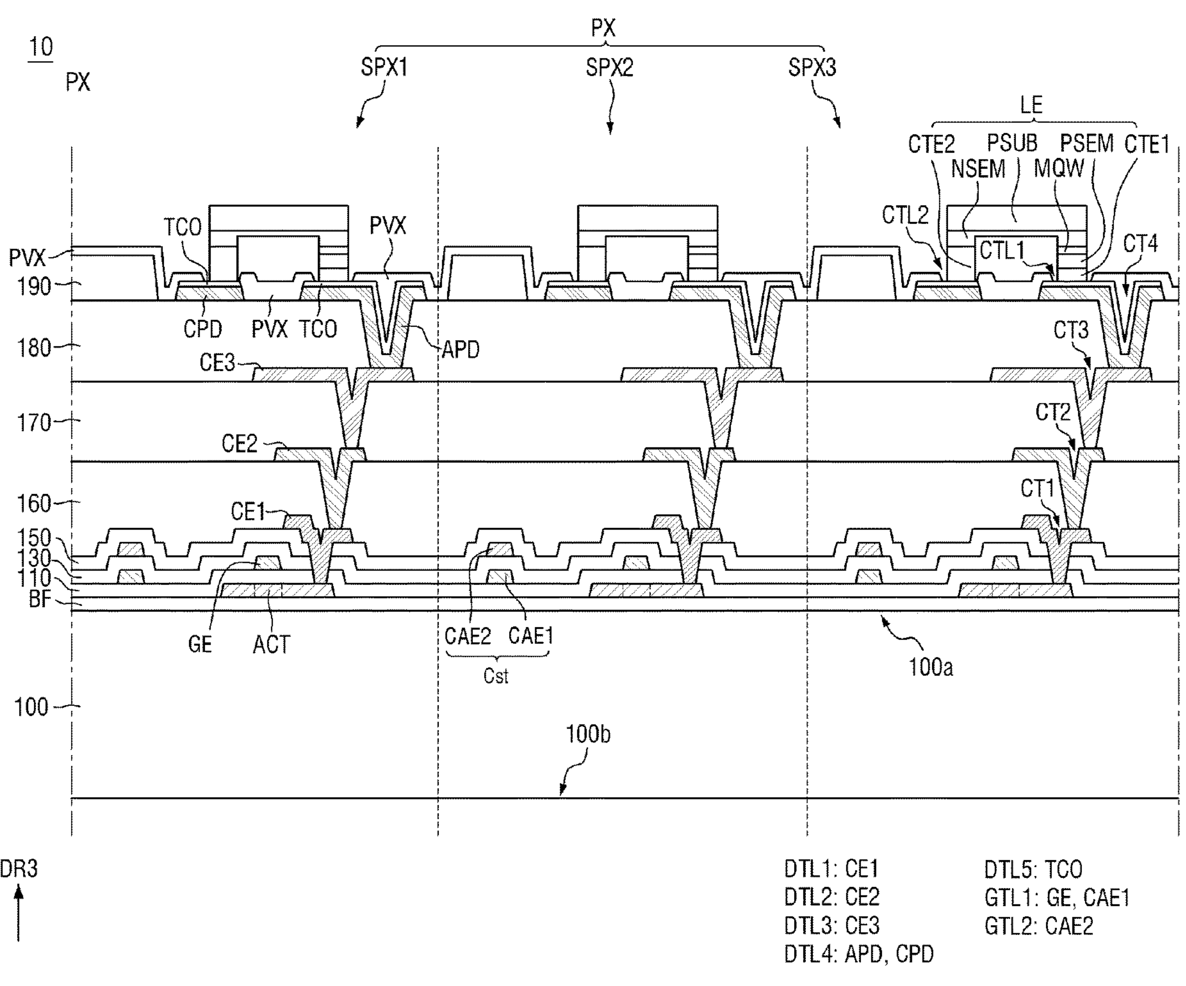
FIG. 5 is a schematic cross-sectional view of a pixel of the display device according to an embodiment of the disclosure.

FIG. 3 schematically illustrates the structure of a pixel of the display device according to an embodiment of the disclosure. FIG. 4 schematically illustrates the structure of a pixel of a display device according to another embodiment of the disclosure. FIG. 5 is a schematic cross-sectional view of a pixel of the display device according to an embodiment of the disclosure.

Referring to FIGS. 3 and 4, a pixel PX may include subpixels. In FIGS. 3 and 4, the pixel PX may include three subpixels (i.e., first, second, and third subpixels SPX1, SPX2, and SPX3), but the number of subpixels included in the pixel PX is not limited thereto. Each of the first, second, and third subpixels SPX1, SPX2, and SPX3 may be electrically connected to a data line and at least one scan line.

The first, second, and third subpixels SPX1, SPX2, and SPX3 may have a rectangular, square, or rhombus shape in a plan view. For example, as illustrated in FIG. 3, the first, second, and third subpixels SPX1, SPX2, and SPX3 may have a rectangular shape having long sides extending in the first direction DR1 and short sides extending in the second direction DR2 in a plan view. In another example, as illustrated in FIG. 4, the first, second, and third subpixels SPX1, SPX2, and SPX3 may have a square or rhombus shape having a same length in the first and second directions DR1 and DR2.

The first, second, and third subpixels SPX1, SPX2, and SPX3 may be arranged in the second direction DR2. As another example, the first subpixel SPX1 may be arranged side-by-side in the second direction DR2 with one of the second and third subpixels SPX2 and SPX3 and side-by-side (or adjacent to each other) in the first direction DR1 with another subpixel (e.g., another first subpixel SPX1). For example, the second and third subpixels SPX2 and SPX3 may be disposed between the first subpixel SPX1 and another first subpixel SPX1 in the second direction DR2. The first subpixel SPX1 and another first subpixel SPX1 in the first direction DR1 may be arranged in parallel. For example, as illustrated in FIG. 4, the first and second subpixels SPX1 and SPX2 may be arranged side-by-side (or be adjacent to each other) in the first direction DR1, and the first and third subpixels SPX1 and SPX3 may be arranged side-by-side in (or be adjacent to each other) the second direction DR2.

The first subpixel SPX1 may emit first light, the second subpixel SPX2 may emit second light, and the third subpixel SPX3 may emit third light. The first light may be light of a red wavelength band, the second light may be light of a green wavelength band, and the third light may be light of a blue wavelength band. The red wavelength band may be, but is not limited to, a wavelength band in a range of about 600 nm to about 750 nm. The green wavelength band may be, but is not limited to, a wavelength band in a range of about 480 nm to about 560 nm. The blue wavelength band may be, but is not limited to, a wavelength band in a range of about 370 nm to about 460 nm.

Each of the first, second, and third subpixels SPX1, SPX2, and SPX3 may include light-emitting elements LE (see, e.g., FIG. 5), which emit light and include an inorganic semiconductor. For example, the light-emitting elements LE may be flip chip-type micro-light-emitting diodes (LEDs), but the disclosure is not limited thereto.

As illustrated in FIGS. 3 and 4, the first, second, and third subpixels SPX1, SPX2, and SPX3 may have substantially a same size, but the disclosure is not limited thereto. Another example, the first, second, and third subpixels SPX1, SPX2, and SPX3 may have different sizes.

Referring to FIG. 5, each of the first, second, and third subpixels SPX1, SPX2, and SPX3 may include conductive layers, insulating layers, and light-emitting elements LE. The conductive layers and the insulating layers of each of the first, second, and third subpixels SPX1, SPX2, and SPX3 may form a transistor layer transmitting electrical signals to the light-emitting elements LE.

Each of the first, second, and third subpixels SPX1, SPX2, and SPX3, which are disposed on the substrate 100, may include conductive layers, e.g., an active layer ACT, a first gate metal layer GTL1, a second gate metal layer GTL2, a first data metal layer DTL1, a second data metal layer DTL2, a third data metal layer DTL3, a fourth data metal layer DTL4, and a fifth data metal layer DTLS. Each of the first, second, and third subpixels SPX1, SPX2, and SPX3 may further include insulating layers, e.g., a buffer layer BF, a gate insulating layer 110, a first interlayer insulating layer 130, a second interlayer insulating layer 150, and an upper via layer, and the upper via layer may include a first via layer 160, a second via layer 170, a third via layer 180, and a fourth via layer 190.

The substrate 100 may form the base of the display device 10 and may be a base substrate or a base member for supporting the pixel PX. As already mentioned above, the substrate 100 may be a rigid material formed of glass.

The buffer layer BF may be disposed on the top surface of the substrate 100, e.g., on the first surface of the substrate 100. The buffer layer BF may prevent the air or moisture from infiltrating into other layers of the pixel PX. The buffer layer BF may include inorganic films that are alternately stacked each other. For example, the buffer layer BF may be formed as a multifilm in which at least one inorganic film including at least one of a silicon nitride layer, a silicon oxynitride layer, a silicon oxide layer, a titanium oxide layer, and an aluminum oxide layer, which are alternately stacked each other. In some embodiments, the buffer layer BF may not be provided.

The active layer ACT may be disposed on the buffer layer BF. The active layer ACT may include a silicon semiconductor such as polycrystalline silicon, monocrystalline silicon, low-temperature polycrystalline silicon, amorphous silicon, or a combination thereof or may include an oxide semiconductor.

The active layer ACT may include a channel region, a first region, and a second region. The first and second regions may be disposed on both sides of the channel region. The channel region of the active layer ACT may be at least a part of the active layer ACT that overlaps a gate electrode GE in the third direction DR3. The first and second regions of the active layer ACT may be at least parts of the active layer ACT that do not overlap the gate electrode GE in a plan view. The first and second regions may be conductive regions obtained by doping a silicon semiconductor or an oxide semiconductor with ions.

The gate insulating layer 110 may be disposed on the active layer ACT. The gate insulating layer 110 may be formed as an inorganic film such as, for example, a silicon nitride layer, a silicon oxynitride layer, a silicon oxide layer, a titanium oxide layer, an aluminum oxide layer, or a combination thereof.

The first gate metal layer GTL1 may be disposed on the gate insulating layer 110. The first gate metal layer GTL1 may include the gate electrode GE and a first capacitor electrode CAE1. The gate electrode GE and the active layer ACT may form a thin-film transistor (TFT) for forming the pixel PX. The first gate metal layer GTL1 may be formed as a single layer or a multilayer including at least one of molybdenum (Mo), aluminum (Al), chromium (Cr), gold (Au), titanium (Ti), nickel (Ni), neodymium (Nd), copper (Cu), and an alloy thereof.

The first interlayer insulating layer 130 may be disposed on the first gate metal layer GTL1. The first interlayer insulating layer 130 may be formed as an inorganic film such as, for example, a silicon nitride layer, a silicon oxynitride layer, a silicon oxide layer, a titanium oxide layer, an aluminum oxide layer, or a combination thereof.

The second gate metal layer GTL2 may be disposed on the first interlayer insulating layer 130. The second gate metal layer GTL2 may include a second capacitor electrode CAE2. The second capacitor electrode CAE2 may overlap the first capacitor electrode CAE1 in the third direction DR3 to form a capacitor Cst. The second gate metal layer GTL2 may be formed as a single layer or a multilayer including Mo, Al, Cr, Au, Ti, Ni, Nd, Cu, or an alloy thereof.

The second interlayer insulating layer 150 may be disposed on the second gate metal layer GTL2. The second interlayer insulating layer 150 may be formed as an inorganic film such as, for example, a silicon nitride layer, a silicon oxynitride layer, a silicon oxide layer, a titanium oxide layer, an aluminum oxide layer, or a combination thereof.

The first data metal layer DTL1, which includes a first connecting electrode CE1 and a data line (not illustrated), may be disposed on the second interlayer insulating layer 150. The first data metal layer DTL1 may be formed as a single layer or a multilayer including at least one of Mo, Al, Cr, Au, Ti, Ni, Nd, Cu, and an alloy thereof. In some embodiments, the first data metal layer DTL1 may have a Ti/A1 double-layer structure or a Ti/Al/Ti triple-layer structure. For convenience of explanation, the first data metal layer DTL1 will hereinafter be described as having a Ti/Al/Ti triple-layer structure.

The first connecting electrode CE1 may be electrically connected to the first or second region of the active layer ACT through a first contact hole CT1, which penetrates the first and second interlayer insulating layers 130 and 150.

The first via layer 160, which planarizes step differences (or height differences) formed by the active layer ACT, the first gate metal layer GTL1, the second gate metal layer GTL2, and the first data metal layer DTL1, may be disposed on the first data metal layer DTL1. The first via layer 160 may be formed as an organic film including at least one of an acrylic resin, an epoxy resin, a phenolic resin, a polyamide resin, and a polyimide resin.

The second data metal layer DTL2 may be disposed on the first via layer 160. The second data metal layer DTL2 may include a second connecting electrode CE2. The second connecting electrode CE2 may be electrically connected to the first connecting electrode CE1 through a second contact hole CT2, which penetrates a first insulating layer and the first via layer 160. The second data metal layer DTL2 may be formed as a single layer or a multilayer including at least one of Mo, Al, Cr, Au, Ti, Ni, Nd, Cu, and an alloy thereof. In some embodiments, the second data metal layer DTL2 may have a Ti/Al double-layer structure or a Ti/Al/Ti triple-layer structure. For convenience of explanation, the second data metal layer DTL2 will hereinafter be described as having a Ti/Al/Ti triple-layer structure.

The second via layer 170 may be disposed on the second data metal layer DTL2. The second via layer 170 may be formed as an organic film including at least one of an acrylic resin, an epoxy resin, a phenolic resin, a polyamide resin, and a polyimide resin.

The third data metal layer DTL3 may be disposed on the second via layer 170. The third data metal layer DTL3 may include a third connecting electrode CE3. The third connecting electrode CE3 may be electrically connected to the second connecting electrode CE2 through a third contact hole CT3, which penetrates a second insulating layer and the second via layer 170. The third data metal layer DTL3 may be formed as a single layer or a multilayer including at least one of Mo, Al, Cr, Au, Ti, Ni, Nd, Cu, and an alloy thereof. In some embodiments, the third data metal layer DTL3 may have a Ti/Al double-layer structure or a Ti/Al/Ti triple-layer structure. For convenience of explanation, the third data metal layer DTL3 will hereinafter be described as having a Ti/Al/Ti triple-layer structure.

The third via layer 180 may be disposed on the third data metal layer DTL3. The third via layer 180 may be formed as an organic film including at least one of an acrylic resin, an epoxy resin, a phenolic resin, a polyamide resin, and a polyimide resin.

The fourth data metal layer DTL4 may be disposed on the third via layer 180. The fourth data metal layer DTL4 may include an anode pad electrode APD and a cathode pad electrode CPD. The anode pad electrode APD may be electrically connected to the third connecting electrode CE3 through a fourth contact hole CT4, which penetrates a third insulating layer and the third insulating layer 180. The cathode pad electrode CPD may receive a first power supply voltage, which is a low-potential voltage. The fourth data metal layer DTL4 may be formed as a single layer or a multilayer including at least one of Mo, Al, Cr, Au, Ti, Ni, Nd, Cu, and an alloy thereof. In some embodiments, the fourth data metal layer DTL4 may have a Ti/Al double-layer structure or a Ti/Al/Ti triple-layer structure. For convenience of explanation, the fourth data metal layer DTL4 will hereinafter be described as having a Ti/Al/Ti triple-layer structure.

The fifth data metal layer DTL5 may be disposed on the anode pad electrode APD and the cathode pad electrode CPD. The fifth data metal layer DTL5 may include a transparent conductive layer TCO, which enhances an adhesion to first and second contact electrodes CTE1 and CTE2 of a light-emitting element LE. The fifth data metal layer DTL5 may be formed of a transparent conductive oxide (TCO) such as indium tin oxide (ITO) or indium zinc oxide (IZO).

The fourth via layer 190 may be further disposed on the third via layer 180. The fourth via layer 190 may be disposed in a gap in each of the first, second, and third subpixels SPX1, SPX2, and SPX3. For example, the fourth via layer 190 may be disposed between adjacent ones of the first, second, and third subpixels SPX1, SPX2, and SPX3. For example, the fourth via layer 190 may be disposed on at least a part of the third via layer 180. The fourth via layer 190 may not be disposed on the entire third via layer 180. For example, the fourth via layer 190 may function as (or be implemented with) a pixel-defining film for defining each of the first, second, and third subpixels SPX1, SPX2, and SPX3. The fourth via layer 190 may be formed as an organic film including at least one of an acrylic resin, an epoxy resin, a phenolic resin, a polyamide resin, and a polyimide resin.

An upper passivation layer PVX may be disposed on the third via layer 180, the fifth data metal layer DTL5, and the fourth via layer 190. The upper passivation layer PVX may cover edges of at least a part of the transparent conductive layer TCO on the anode pad electrode APD and edges of at least a part of the transparent conductive layer TCO on the cathode pad electrode CPD. The upper passivation layer PVX may also cover a top surface and sides (or side surfaces) of the fourth via layer 190, and at least a part of a top surface of the third via layer 180, which is exposed by the fourth via layer 190. The upper passivation layer PVX may be formed as an inorganic film such as, for example, a silicon nitride layer, a silicon oxynitride layer, a silicon oxide layer, a titanium oxide layer, an aluminum oxide layer, or a combination thereof.

A first device contact hole CTL1 and a second device contact hole CTL2, which expose the part of the transparent conductive layer TCO on the anode pad electrode APD and the part of the transparent conductive layer TCO on the cathode pad electrode CPD, may be formed in the upper passivation layer PVX. The first device contact hole CTL1 may partially expose the part of the transparent conductive layer TCO on the anode pad electrode APD, and the second device contact hole CTL2 may partially expose the part of the transparent conductive layer TCO disposed on the cathode pad electrode CPD.

Each of the first, second, and third subpixels SPX1, SPX2, and SPX3 may include a light-emitting element LE. The light-emitting element LE may be disposed on a part of the transparent conductive layer TCO, which is disposed on the anode pad electrode APD and exposed by the first and second device contact holes CTL1 and CTL2, and a part of the cathode pad electrode CPD. FIG. 5 illustrates that the light-emitting element LE is a flip chip-type micro-LED in which the first and second contact electrodes CTE1 and CTE2 are disposed to face the anode pad electrode APD and the cathode pad electrode CPD, respectively.

The light-emitting element LE may be an inorganic light-emitting element formed of an inorganic material such as GaN. The light-emitting element LE may have a length of several micrometers to hundreds of micrometers in the first, second, and third directions DR1, DR2, and DR3. For example, the light-emitting element LE may have a length of about 100 μm in the first, second, and third directions DR1, DR2, and DR3.

The light-emitting element LE may be grown on a semiconductor substrate such as a silicon wafer. The light-emitting element LE may be transferred from the silicon wafer onto the anode pad electrode APD and the cathode pad electrode CPD of the substrate 100. As another example, the light-emitting element LE may be transferred onto the anode pad electrode APD and the cathode pad electrode CPD of the substrate 100 via an electrostatic method using an electrostatic head or via stamping method using an elastic polymer material such as polydimethylsiloxane (PDMS) or silicone as a transfer substrate.

The light-emitting element LE may be a light-emitting structure including a base substrate PSUB, an n-type semiconductor NSEM, an active layer MQW, a p-type semiconductor PSEM, the first contact electrode CTE1, and the second contact electrode CTE2.

The base substrate PSUB of the light-emitting element LE may be a sapphire substrate, but the disclosure is not limited thereto.

The n-type semiconductor NSEM of the light-emitting element LE may be disposed on a surface of the base substrate PSUB. For example, the n-type semiconductor NSEM may be disposed on a bottom surface of the base substrate PSUB. The n-type semiconductor NSEM may be formed of GaN doped with an n-type dopant such as Si, Ge, or Sn.

The active layer MQW of the light-emitting element LE may be disposed on at least a part of a surface of the n-type semiconductor NSEM. The active layer MQW may include a material having a single- or multi-quantum well structure. In case that the active layer MQW includes a material having a multi-quantum well structure, the active layer MQW may have a structure where multiple well layers and multiple barrier layers are alternately stacked each other. The well layers of the active layer MQW may be formed of InGaN, and the barrier layers of the active layer MQW may be formed of GaN or AlGaN. However, the disclosure is not limited to this.

As another example, the active layer MQW may have a structure where a semiconductor material having a large bandgap energy and a semiconductor material having a small bandgap energy are alternately stacked each other and may include a group-III, group-IV, or group-V semiconductor material depending on the wavelength band of light to be emitted.

The p-type semiconductor PSEM may be disposed on the surface of the active layer MQW. The p-type semiconductor PSEM may be formed of GaN doped with a p-type dopant such as Mg, Zn, Ca, Se, Ba, or a combination thereof.

The first contact electrode CTE1 may be disposed on the p-type semiconductor PSEM, and the second contact electrode CTE2 may be disposed on another part of the surface of the n-type semiconductor NSEM. The another part of the surface of the n-type semiconductor NSEM where the second contact electrode CTE2 is disposed may be spaced apart from the part of the surface of the n-type semiconductor NSEM where the active layer MQW is disposed.

The first contact electrode CTE1 and the anode pad electrode APD may be attached to each other via a conductive adhesive member such as an anisotropic conductive film (ACF) or an anisotropic conductive paste (ACP). As another example, the first contact electrode CTE1 and the anode pad electrode APD may be attached to each other via soldering.

It will hereinafter be described how the pixels PX and the side wirings 200, and the side wirings 200 and the driving unit, are arranged.

Figure 6:
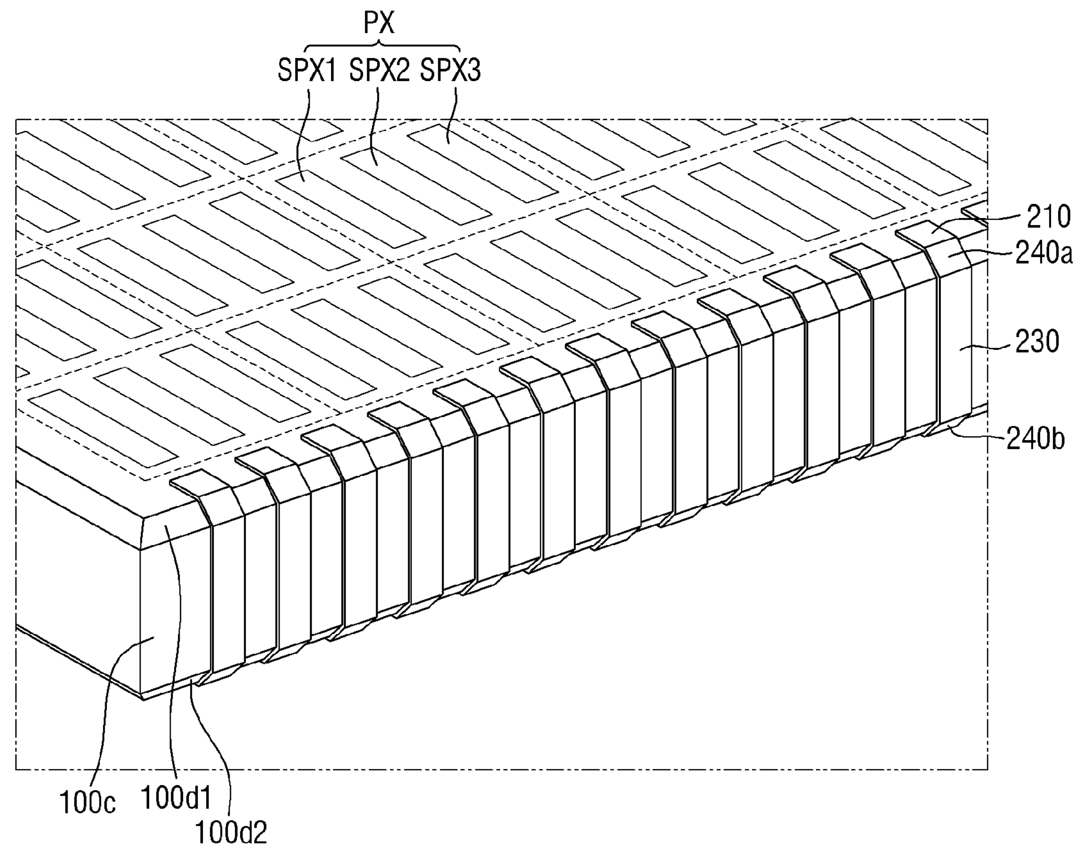
FIG. 6 is a schematic perspective view illustrating the layout of pixels and side wirings of the display device according to an embodiment of the disclosure.
Figure 6:
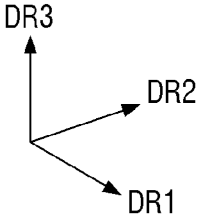
Figure 7:
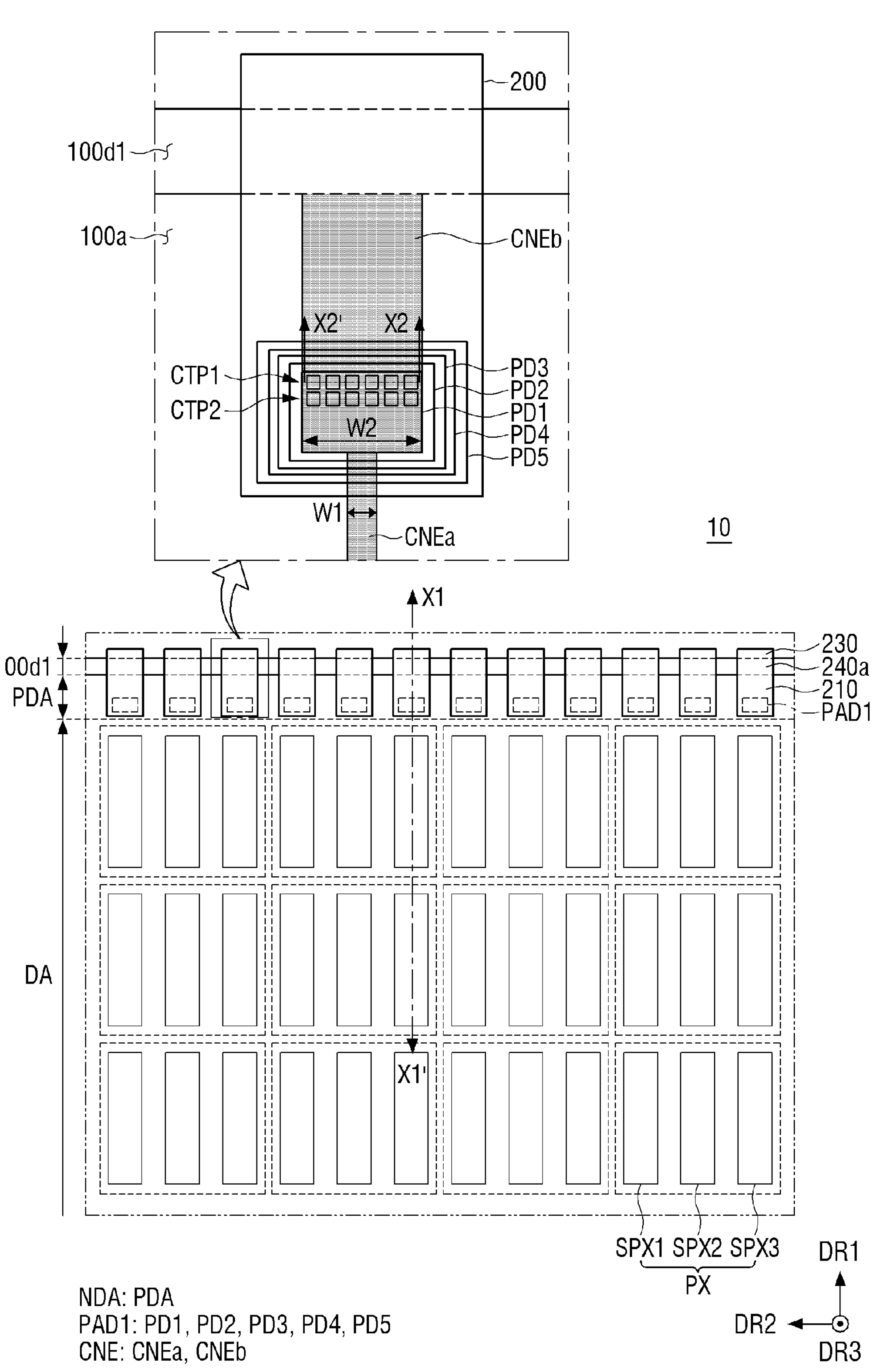
FIG. 7 is a schematic plan view illustrating the layout of the pixels and the side wirings of the display device according to an embodiment of the disclosure.
Figure 8:
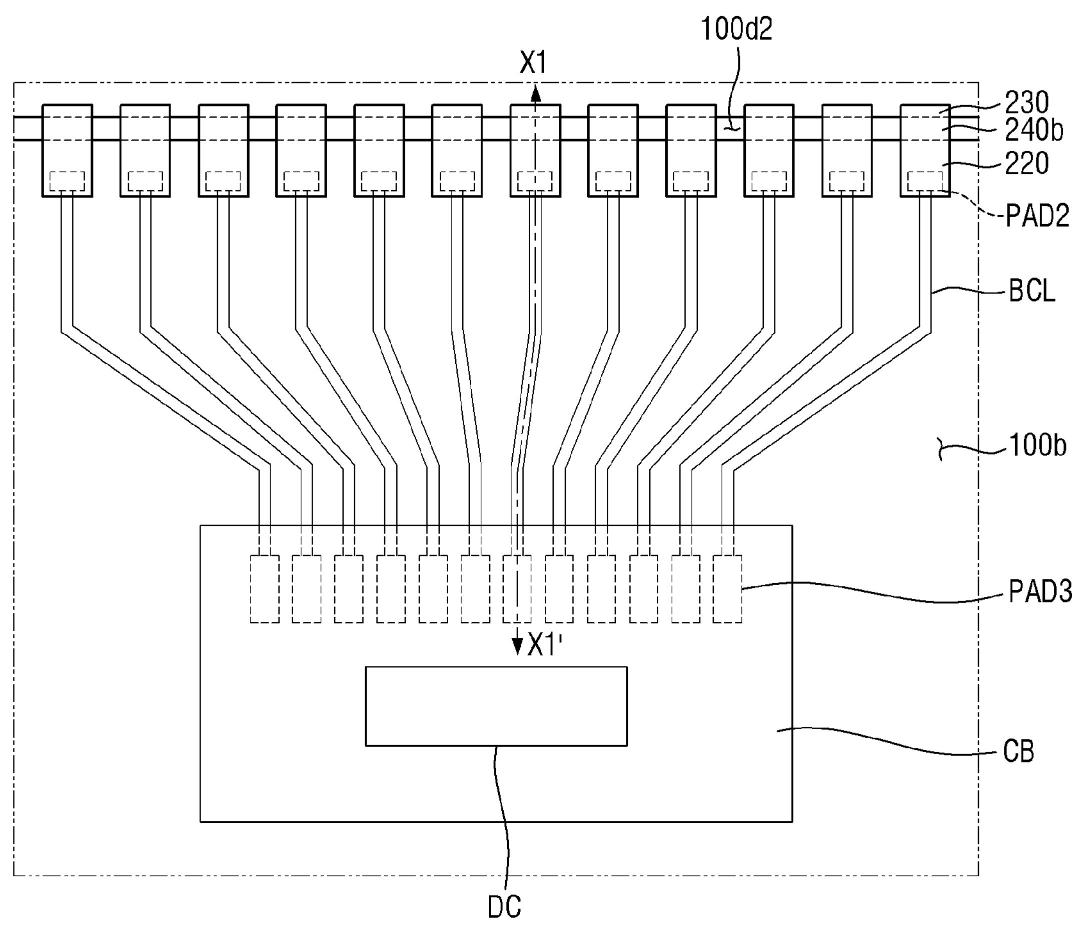
FIG. 8 is a schematic rear view illustrating the layout of the side wirings and a driving part of the display device according to an embodiment of the disclosure.
Figure 8:
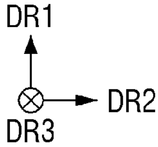

FIG. 6 is a schematic perspective view illustrating the layout of the pixels and the side wirings of the display device according to an embodiment of the disclosure. FIG. 7 is a schematic plan view illustrating the layout of the pixels and the side wirings of the display device according to an embodiment of the disclosure. FIG. 8 is a schematic rear view illustrating the layout of the side wirings and the driving part of the display device according to an embodiment of the disclosure.

Referring to FIGS. 6 to 8, the display device 10 may further include first pads PAD1, second pads PAD2, third pads PADS, and bottom connecting electrodes BCL.

The first pads PAD1 may transmit electrical signals from the driving part to the pixels PX. The first pads PAD1 may be disposed on the first surface 100*a* of the substrate 100. The first pads PAD1 may be disposed along a first-side edge, in the first direction DR1, of the first surface 100*a* of the substrate 100, e.g., in a pad area PDA. The pad area PDA may refer to at least a part of the non-display area NDA on a first side, in the first direction DR1, of the display area DA. The first pads PAD1 may be arranged in the second direction DR2.

Referring to FIG. 7, the first pads PAD1 may include first upper pad electrodes PD1, second upper pad electrodes PD2, third upper pad electrodes PD3, fourth upper pad electrodes PD4, and fifth upper pad electrodes PD5, which are sequentially stacked in the third direction DR3. Detailed description of the first upper pad electrodes PD1, the second upper pad electrodes PD2, the third upper pad electrodes PD3, the fourth upper pad electrodes PD4, and the fifth upper pad electrodes PD5 is provided below.

Top connecting electrodes CNE may be disposed below the first pads PAD1. The top connecting electrodes CNE may be included in the second gate metal layer GTL2. Accordingly, the second interlayer insulating layer 150 may be disposed between the first pads PAD1 and the top connecting electrodes CNE (see, e.g., FIG. 9).

The top connecting electrodes CNE may include wiring portions CNEa, which are electrically connected to the pixels PX in the display area DA, and electrically contact portions CNEb, which are electrically connected to the first pads PAD1. The wiring portions CNEa and the contact portions CNEb may be integral with each other.

The wiring portions CNEa may have a first width W1 in the second direction DR2 and may extend in the first direction DR1. The contact portions CNEb may have a second width W2, which is greater than the first width W1, in the second direction DR2 and may extend in the first direction DR1. In some embodiments, the wiring portions CNEa may protrude from the middle of the contact portions CNEb, but the disclosure is not limited thereto.

The contact portions CNEb may have the second width W2 in the second direction DR2 and may extend in the first direction DR1. The contact portions CNEb may be adjacent to a boundary between the first surface 100*a* and the first chamfered surface 100*d*1 of the substrate 100. For example, the contact portions CNEb may include portions overlapping the first pads PAD1 in the third direction DR3 and portions not overlapping the first pads PAD1 in the third direction DR3. The contact portions CNEb may be formed to extend near (or to adjacent to) the boundary between the first surface 100*a* and the first chamfered surface 100*d*1 of the substrate 100 because at least a part of the substrate SUB and at least parts of the contact portions CNEb are processed at the same time during the formation of the first chamfered surface 100*d*1.

The contact portions CNEb may be formed in the second interlayer insulating layer 150, in at least parts of the top connecting electrodes CNE overlapping the first pads PAD1 in the third direction DR3. The contact portions CNEb may be electrically connected to the first pads PAD1 through pad contact holes CTP1 and CTP2, which are disposed in the parts of the top connecting electrodes CNE overlapping the first pads PAD1 in the third direction DR3. Detailed description of the above elements is provided below.

In some embodiments, first pad contact holes CTP1 may be spaced apart from one another in the second direction DR2. The second pad contact holes CTP2 may be spaced apart from the first pad contact holes CTP1 in the first direction DR1. The second pad contact holes CTP2 may be spaced apart from one another in the second direction DR2. However, the disclosure is not limited to this.

The second pads PAD2 may transmit electrical signals from the driving part to the first pads PAD1 through the side wirings 200. The second pads PAD2 may be disposed on the second surface 100*b* of the substrate 100. The second pads PAD2 may be disposed along a first-side edge, in the first direction DR1, of the second surface 100*b* of the substrate 100. The second pads PAD2 may be arranged in the second direction DR2.

The third pads PAD3 may transmit electrical signals from the driving part to the second pads PAD2 through the bottom connecting electrodes BCL. The third pads PAD3 may be disposed on the second surface 100*b* of the substrate 100. The third pads PAD3 may be disposed closer than the second pads PAD2 to the middle of the second surface 100*b* of the substrate 100. For example, a distance between the third pads PAD3 and the middle of the second surface 100*b* of the substrate 100 may be less than a distance between the second pads PAD2 and the middle of the second surface 100*b* of the substrate 100. The third pads PAD3 may be arranged in the second direction DR2. The third pads PAD3 may be arranged to correspond to terminals formed in the driving part. For example, the third pads PAD3 may be arranged to correspond to the terminals formed on the circuit boards CB of the driving part. A distance, in the second direction DR2, between the third pads PAD3 may be less than a distance, in the second direction DR2, between the second pads PAD2 in order to electrically connect more third pads PAD3 to the circuit boards CB. Thus, the number of the third pads PAD3 electrically connected to the circuit board CB may be increased.

The bottom connecting lines BCL may electrically connect the second pads PAD2 and the third pads PAD3. As the distance, in the first direction DR1, between the second pads PAD2 differs from the distance, in the first direction DR1, between the third pads PAD3, the bottom connecting electrodes BCL may be bent at least once. The bottom connecting electrodes BCL may be integrally formed with the second pads PAD2 and the third pads PAD3. The second pads PAD2, the third pads PAD3, and the bottom connecting electrodes BCL may be formed as single layers or multi-layers including at least one of Mo, Al, Cr, Au, Ti, Ni, Nd, Cu, and an alloy thereof.

The side wirings 200 may include first flat portions 210, first inclined portions 240*a*, connecting portions 230, second inclined portions 240*b*, and second flat portions 220.

The first flat portions 210 of the side wirings 200 may be at least parts of the side wirings 200 disposed on the first surface 100*a* of the substrate 100. For example, the first flat portions 210 of the side wirings 200 may be disposed in the pad area PDA of the first surface 100*a*. The first flat portions 210 may be disposed on the first pads PAD1 and cover (e.g., completely cover) the first pads PAD1. The first flat portions 210 may be electrically connected to the first pads PAD1.

The first inclined portions 240*a* of the side wirings 200 may be at least parts of the side wirings 200 disposed on the first chamfered surface 100*d*1 of the substrate 100. The first inclined portions 240*a* may form slopes in a direction in which the first chamfered surface 100*d*1 is inclined. The first inclined portions 240*a* may be disposed between the first flat portions 210 and the connecting portions 230.

The connecting portions 230 of the side wirings 200 may be disposed on the first lateral side 100*c* of the substrate 100. The connecting portions 230 may be disposed between the first inclined portions 240*a* and the second inclined portions 240*b*.

The second inclined portions 240*b* of the side wirings 200 may be at least parts of the side wirings 200 disposed on the second chamfered surface 100*d*2 of the substrate 100. The second inclined portions 240*b* may form slopes in a direction in which the second chamfered surface 100*d*2 is inclined. The second inclined portions 240*b* may be disposed between the second flat portions 220 and the connecting portions 230.

The second flat portions 220 of the side wirings 200 may be at least parts of the side wirings 200 disposed on the second surface 100*b* of the substrate 100. The second flat portions 220 may be disposed on the second pads PAD2 and cover (e.g., completely cover) the second pads PAD2. The second flat portions 220 may be electrically connected to the second pads PAD2.

The side wirings 200 (e.g., refer to FIG. 10) may include metal powder and a polymer. For example, the side wirings 200 may include a mixture of a metal powder and a polymer. The metal powder of the side wirings 200 may include particles of a metal such as silver (Ag) or Cu, and a polymer such as an acrylic resin or an epoxy resin (see, e.g., FIG. 10). The metal powder may allow the side wirings 200 to have conductivity, and the polymer may function as (or be implemented with) a binder for connecting the metal particles.

The side wirings 200 may be formed by printing a metal paste on the substrate 100 via a silicon pad and sintering the metal paste using a laser. The metal paste may include the metal particles, a monomer, and a solution. Since the monomer of the metal paste is transformed into a polymer by heat generated by the laser during the sintering process, the metal particles may be in close contact with one another and agglomerate. Thus, a resistance of the metal paste may be lowered.

The structure of a first-side part, in the first direction DR1, of the display device 10 where the boundary between the display area DA and the pad area PDA lies will hereinafter be described.

Figure 9:
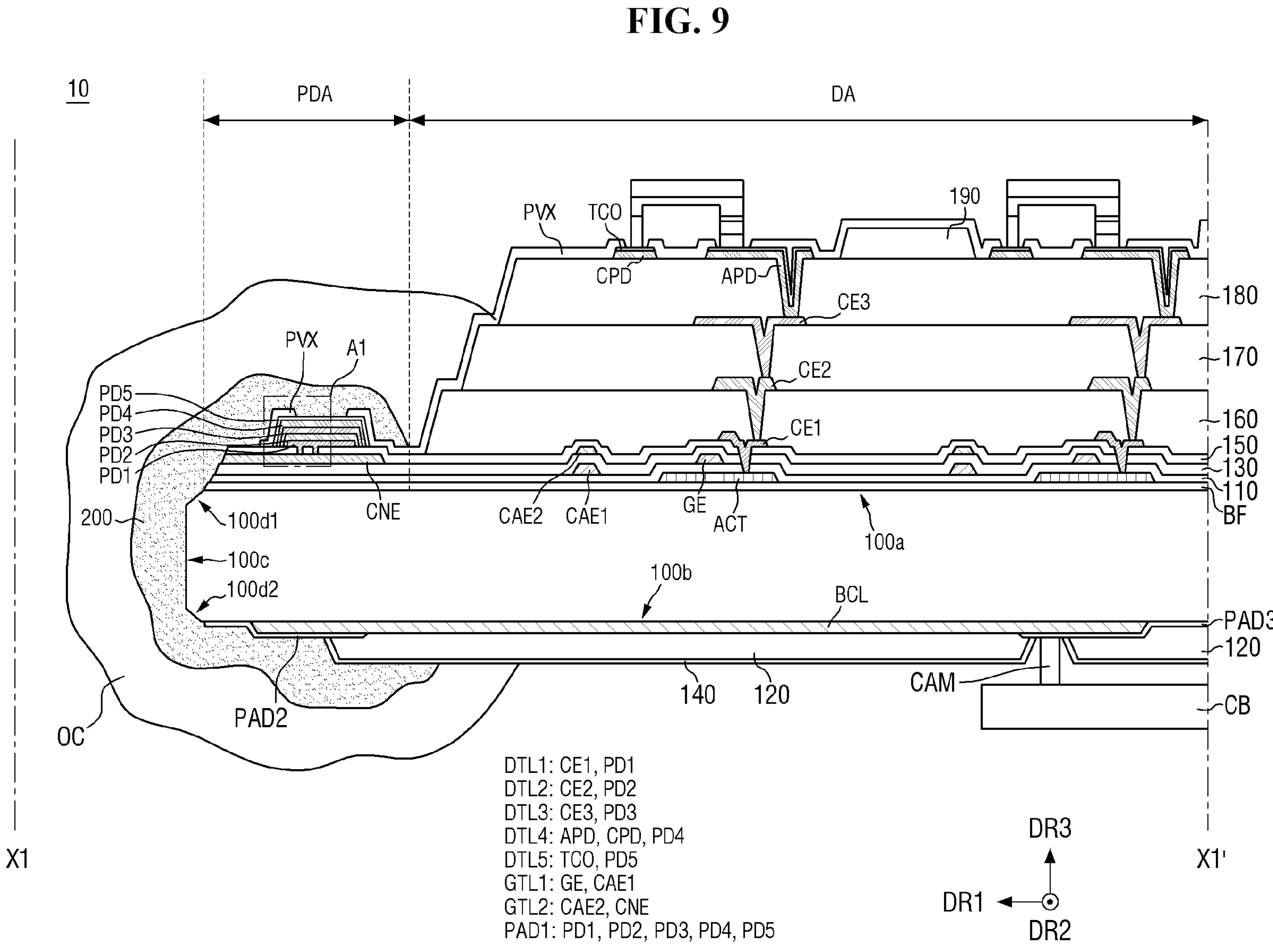
FIG. 9 is a schematic cross-sectional view taken along line X1-X1' of FIG. 7 or 8.
Figure 10:
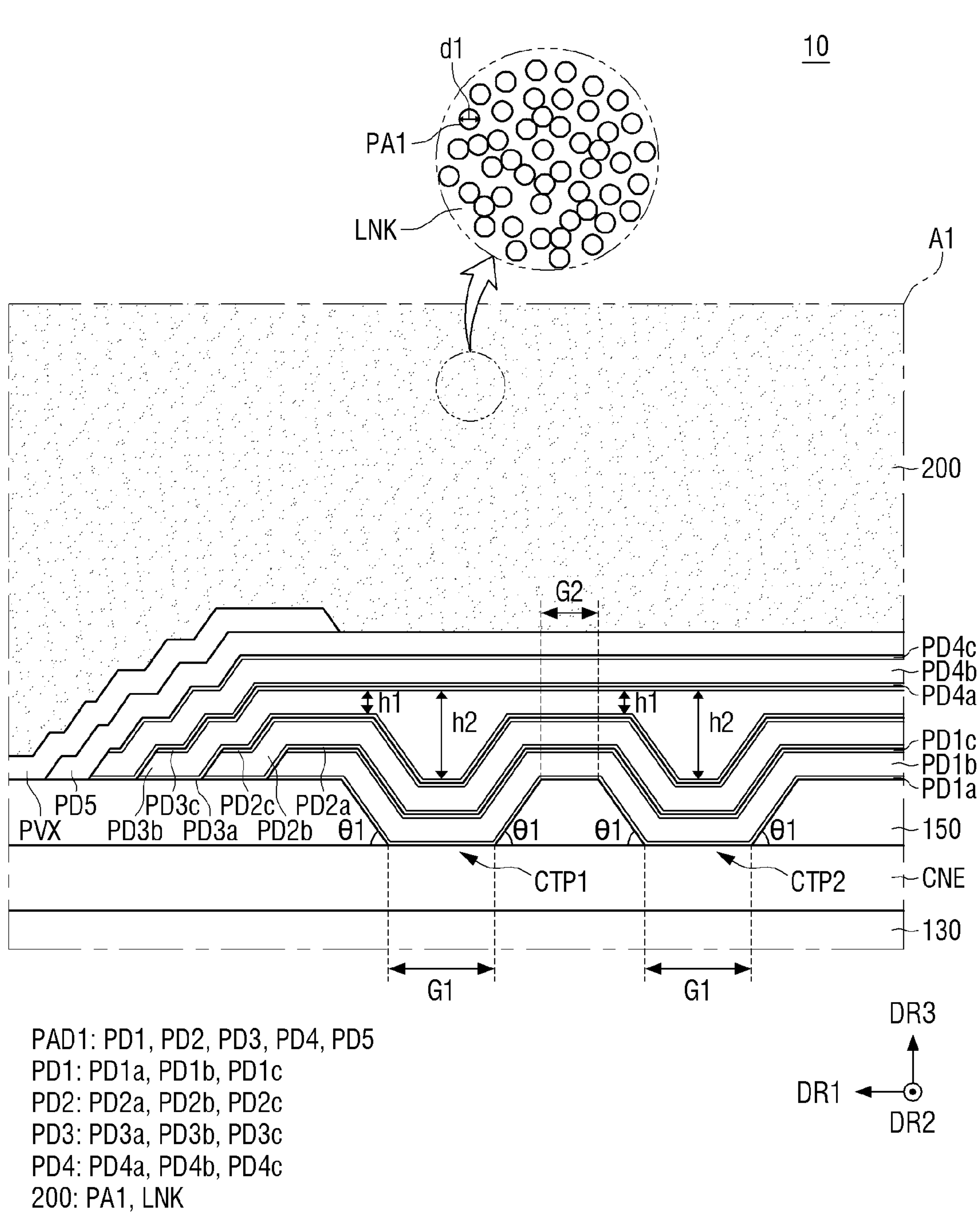
FIG. 10 is a schematic enlarged cross-sectional view of area A1 of FIG. 9.
Figure 11:
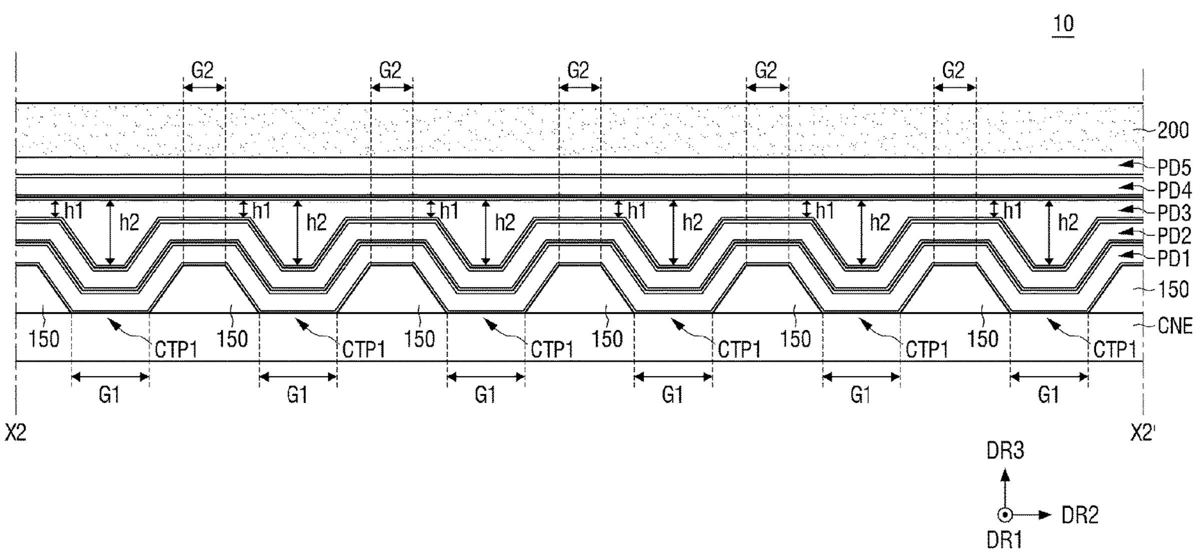
FIG. 11 is a schematic cross-sectional view taken along line X2-X2' of FIG. 7.

FIG. 9 is a schematic cross-sectional view taken along line X1-X1' of FIG. 7 or 8. FIG. 10 is a schematic enlarged cross-sectional view of area A1 of FIG. 9. FIG. 11 is a schematic cross-sectional view taken along line X2-X2' of FIG. 7.

Referring to FIGS. 9 to 11, the first pads PAD1 may be disposed near (or be disposed adjacent to outermost subpixels) and be spaced apart from the outermost subpixels. The second pads PAD2 may be disposed on the second surface 100*b* of the substrate 100.

For convenience of explanation, subpixels disposed closest to the pad area PDA will hereinafter be referred to as the outermost subpixels. The outermost subpixels, which are disposed along a first-side edge, in the first direction DR1, of the display area DA, and subpixels may be disposed only on second sides, in the first direction DR1, of the outermost subpixels, but not on first sides, in the first direction DR1, of the outermost subpixels. Accordingly, the fourth via layer 190 may be disposed not on the first sides, in the first direction DR1, of the outermost subpixels, but on the second sides, in the first direction DR1, of the outermost subpixels.

The outermost subpixels have the same structure as the first, second, and third subpixels SPX1, SPX2, and SPX3 of FIG. 5, and thus, a detailed description of the structure of the outermost subpixels is omitted.

In the pad area PDA, the second gate metal layer GTL2 may further include the top connecting electrodes CNE, the first data metal layer DTL1 may further include the first upper pad electrodes PD1, the second data metal layer DTL2 may further include the second upper pad electrodes PD2, the third data metal layer DTL3 may further include the third upper pad electrodes PD3, the fourth data metal layer DTL4 may further include the fourth upper pad electrodes PD4, and the fifth data metal layer DTLS may further include the fifth upper pad electrodes PDS.

The first pads PAD1 may include the first upper pad electrodes PD1, the second upper pad electrodes PD2, the third upper pad electrodes PD3, the fourth upper pad electrodes PD4, and the fifth upper pad electrodes PDS. For example, the second interlayer insulating layer 150 may be disposed on the top connecting electrodes CNE, the first upper pad electrodes PD1 may be disposed on the second interlayer insulating layer 150, the second upper pad electrodes PD2 may be disposed on the first upper pad electrodes PD1, the third upper pad electrodes PD3 may be disposed on the second upper pad electrodes PD2, the fourth upper pad electrodes PD4 may be disposed on the third upper pad electrodes PD3, and the fifth upper pad electrodes PDS may be disposed on the fourth upper pad electrodes PD4.

As already mentioned above, as the first, second, third, and fourth data metal layers DTL1, DTL2, DTL3, and DTL4 have a Ti/Al/Ti triple-layer structure, the first upper pad electrodes PD1, the second upper pad electrodes PD2, the third upper pad electrodes PD3, and the fourth upper pad electrodes PD4 may also have a Ti/Al/Ti triple-layer structure. For example, each of the first upper pad electrodes PD1 may include a first layer PD1*a*, which is formed of Ti, a second layer PD1*b*, which is disposed on the first layer PD1*a* and is formed of Al, and a third layer PD1*c*, which is disposed on the second layer PD1*b* and is formed of Ti, each of the second upper pad electrodes PD2 may include a first layer PD2*a,* which is formed of Ti, a second layer PD2*b,* which is disposed on the first layer PD2*a* and is formed of Al, and a third layer PD2*c,* which is disposed on the second layer PD2*b* and is formed of Ti, each of the third upper pad electrodes PD3 may include a first layer PD3*a,* which is formed of Ti, a second layer PD3*b,* which is disposed on the first layer PD3*a* and is formed of Al, and a third layer PD3*c,* which is disposed on the second layer PD3*b* and is formed of Ti, and each of the fourth upper pad electrodes PD4 may include a first layer PD4*a,* which is formed of Ti, a second layer PD4*b,* which is disposed on the first layer PD4*a* and is formed of Al, and a third layer PD4*c,* which is disposed on the second layer PD4*b* and is formed of Ti.

Also, as already mentioned above, as the fifth data metal layers DTL5 include a transparent conductive oxide (TCO) such as ITO or IZO, the fifth upper pad electrodes PD5 may also include a transparent conductive oxide (TCO) such as ITO or IZO. In some embodiments, the fifth upper pad electrodes PD5 may be formed as single layers, but the disclosure is not limited thereto. For convenience of explanation, the fifth upper pad electrodes PD5 will hereinafter be described as being formed as single layers.

Top surfaces of the first upper pad electrodes PD1 may be in direct contact with bottom surfaces of the second upper pad electrodes PD2. Top surfaces of the second upper pad electrodes PD2 may be in direct contact with bottom surfaces of the third upper pad electrodes PD3. Top surfaces of the third upper pad electrodes PD3 may be in direct contact with bottom surfaces of the fourth upper pad electrodes PD4. Top surfaces of the fourth upper pad electrodes PD4 may be in direct contact with bottom surfaces of the fifth upper pad electrodes PD5. For example, the third layers PD1*c* of the first upper pad electrodes PD1 may be in direct contact with the first layers PD2*a* of the second upper pads PD2. The third layers PD2*c* of the second upper pad electrodes PD2 may be in direct contact with the first layers PD3*a* of the third upper pad electrodes PD3. The third layers PD3*c* of the third upper pad electrodes PD3 may be in direct contact with the first layers PD4*a* of the fourth upper pad electrodes PD4. The third layers PD4*c* of the fourth upper pad electrodes PD4 may be in direct contact with the bottom surfaces of the fifth upper pad electrodes PD5.

The second upper pad electrodes PD2 may be disposed on the first upper pad electrodes PD1 to generally cover the top surface and the sides of each of the first upper pad electrodes PD1, the third upper pad electrodes PD3 may be disposed on the second upper pad electrodes PD2 to generally cover the top surface and the sides of each of the second upper pad electrodes PD2, the fourth upper pad electrodes PD4 may be disposed on the third upper pad electrodes PD3 to generally cover the top surface and the sides of each of the third upper pad electrodes PD3, and the fifth upper pad electrodes PD5 may be disposed on the fourth upper pad electrodes PD4 to generally cover the top surface and the sides of each of the fourth upper pad electrodes PD4.

For example, as illustrated in FIG. 7, in a plan view, the fifth upper pad electrodes PD5 may have a larger area than the fourth upper pad electrodes PD4. The fourth upper pad electrodes PD4 may have a larger area than the third upper pad electrodes PD3. The third upper pad electrodes PD3 may have a larger area than the second upper pad electrodes PD2. The second upper pad electrodes PD2 may have a larger area than the first upper pad electrodes PD1.

The first upper pad electrodes PD1, the second upper pad electrodes PD2, the third upper pad electrodes PD3, the fourth upper pad electrodes PD4, and the fifth upper pad electrodes PD5 may be sequentially stacked. As the first upper pad electrodes PD1, the second upper pad electrodes PD2, the third upper pad electrodes PD3, the fourth upper pad electrodes PD4, and the fifth upper pad electrodes PD5 are sequentially stacked, areas corresponding to the first upper pad electrodes PD1, the second upper pad electrodes PD2, the third upper pad electrodes PD3, the fourth upper pad electrodes PD4, and the fifth upper pad electrodes PD5 may not need to be etched, and as a result, the top connecting electrodes CNE, which are disposed below the first pads PAD1, can be prevented from being etched.

The first upper pad electrodes PD1 of the first pads PAD1 may be disposed on the second interlayer insulating layer 150. The first upper pad electrodes PD1 may be electrically connected to the top connecting electrodes CNE, which are disposed on the first interlayer insulating layer 130, through the pad contact holes (CTP1 and CTP2), which penetrate the second interlayer insulating layer 150. The top connecting electrodes CNE may be electrically connected to the data lines.

The pad contact holes (CTP1 and CTP2), which are for contact with the top connecting electrodes CNE below the first pads PAD1, may be formed in the second interlayer insulating layer 150. For example, the top connecting electrodes CNE may be electrically connected to the first pads PAD1 through the pad contact holes (CTP1 and CTP2). The pad contact holes (CTP1 and CTP2) may penetrate the second interlayer insulating layer 150, which is disposed between the top connecting electrodes CNE and the first pads PAD1.

The bottom connecting electrodes BCL may be disposed on the second surface 100*b* of the substrate 100 and extend in the first direction DR1. The bottom connecting electrodes BCL may be formed as single layers or multilayers including at least one of Mo, Al, Cr, Au, Ti, Ni, Nd, Cu, and an alloy thereof.

The second pads PAD2 may be disposed on the second surface 100*b* of the substrate 100. The second pads PAD2 may be disposed on first sides, in the first direction DR1, of the bottom connecting electrodes BCL, and the third pads PAD3 may be disposed on second sides, in the first direction DR1, of the bottom connecting electrodes BCL. The second pads PAD2 and the third pads PAD3 may be formed of a transparent conductive oxide (TCO) such as ITO or IZO.

A lower via layer 120 may be disposed on the second surface 100*b* of the substrate 100. For example, the lower via layer 120 may be disposed on second surfaces, in the third direction DR3, of the bottom connecting electrodes BCL. The lower via layer 120 may partially cover the second pads PAD2 and the third pads PAD3. At least parts of the second pads PAD2, which are exposed by the lower via layer 120, may be in direct contact with the second flat portions 220 and electrically connected to the second flat portions 220 of the side wirings 200. At least parts of the third pads PAD3, which are exposed by the lower via layer 120, may be electrically connected to the circuit boards CB via conductive adhesive members CAM. The conductive adhesive members CAM may be anisotropic conductive films (ACFs) or anisotropic conductive pastes (ACPs).

The lower via layer 120 may be formed as an organic film including at least one of an acrylic resin, an epoxy resin, a phenolic resin, a polyamide resin, and a polyimide resin.

A lower passivation layer 140 may cover the lower via layer 120. For example, the lower passivation layer 140 may be disposed on the lower via layer 120, and may not be disposed on the second pads PAD2 or the third pads PAD3. For example, at least parts of the second pads PAD2 and at least parts of the third pads PAD3 may be exposed by the lower passivation layer 140. The lower passivation layer 140 may be formed as an inorganic film such as, for example, a silicon nitride layer, a silicon oxynitride layer, a silicon oxide layer, a titanium oxide layer, or an aluminum oxide layer.

The side wirings 200 may be disposed on the first surface 100*a*, the first chamfered surface 100*d*1, the first lateral side 100*c*, the second chamfered surface 100*d*2, and the second surface 100*b* of the substrate 100. The side wirings 200 may be in direct contact with the fifth upper pad electrodes PD5 of the first pads PAD1, which are disposed along a first-side edge, in the first direction DR1, of the first surface 100*a* of the substrate 100 and may thus be electrically connected to the first pads PAD1. The side wirings 200 may be in direct contact with the second pads PAD2, which are disposed along the first-side edge, in the first direction DR1, of the second surface 100*b* of the substrate 100, and may thus be electrically connected to the second pads PAD2. The side wirings 200 may be in contact with the first chamfered surface 100*d*1, the first lateral side 100*c*, and the second chamfered surface 100*d*2 of the substrate 100.

The side wirings 200 may be formed of a crosslinking member LNK and first particles PA1, which are dispersed in the crosslinking member LNK. As already mentioned above, the first particles PA1 may be metal particles and may include Ag or Cu. The crosslinking member LNK may be formed of a polymer such as an acrylic resin or an epoxy resin and may function as a binder for bonding the first particles PA1.

The first particles PA1 may generally have a spherical shape. For example, the first particles PA1 may have a spherical shape or a sphere-like shape. For convenience of explanation, in FIG. 10, the first particles PA1 may have a spherical shape. The first particles PA1 may have a first diameter d1. In some embodiments, the first diameter d1 may be in a range of about 0.1 μm to about 0.3 μm, but the disclosure is not limited thereto.

An overcoat layer OC may be disposed on the first surface 100*a*, the first chamfered surface 100*d*1, the first lateral side 100*c*, the second chamfered surface 100*d*2, and the second surface 100*b* of the substrate 100. The overcoat layer OC may be disposed to cover the side wirings 200. The overcoat layer OC may be formed as an organic insulating film including at least one of an acrylic resin, an epoxy resin, a phenolic resin, a polyamide resin, and a polyimide resin.

The first, second, and third via layers 160, 170, and 180, which extend in the first direction DR1 in the display area DA, may not extend any further near (or may not extend to adjacent to) the boundary between the display area DA and the pad area PDA.

Referring to FIG. 9, openings, which expose the top surfaces of the fifth upper pad electrodes PD5 of the first pads PAD1, may be formed in the upper passivation layer PVX. The side wirings 200 may be electrically connected to the first pads PAD1 through the openings.

The fourth upper pad electrodes PD4 and the fifth upper pad electrodes PD5 may have a substantially flat profile in areas overlapping the openings of the upper passivation layer PVX in a plan view, regardless of step differences formed by the pad contact holes (CTP1 and CTP2). Accordingly, the contact between the first pads PAD1 and the side wirings 200 can be improved due to the openings of the upper passivation layer PVX, and the contact resistance between the first pads PAD1 and the side wirings 200 can be lowered. Thus, the performance of the display device 10 can be improved. In some embodiments, the second upper pad electrodes PD3 may compensate for the step differences formed by the pad contact holes (CTP1 and CTP2), in the areas overlapping the openings of the upper passivation layer PVX in a plan view. The fourth upper pad electrodes PD4 and the fifth upper pad electrodes PD5 may be formed to have a substantially uniform thickness and may thus have a substantially flat profile in the areas overlapping the openings of the upper passivation layer PVX in a plan view. However, the disclosure is not limited thereto. As another example, the second upper pad electrodes PD2 of the first pads PAD1 may compensate for the step differences formed by the pad contact holes (CTP1 and CTP2), in the areas overlapping the openings of the upper passivation layer PVX in a plan view, and the third upper pad electrodes PD3, the fourth upper pad electrodes PD4, and the fifth upper pad electrodes PD5 may be formed to have a substantially uniform thickness and a substantially flat profile in the areas overlapping the openings of the upper passivation layer PVX in a plan view. In FIGS. 10 and 11, the third upper pad electrodes PD3 may compensate for the step differences formed by the pad contact holes (CTP1 and CTP2). For convenience of explanation, the third upper pad electrodes PD3 will hereinafter be described as compensating for the step differences formed by the pad contact holes (CTP1 and CTP2).

Referring to FIGS. 10 and 11, the first upper pad electrodes PD1 and the second upper pad electrodes PD2, which form the first pads PAD1, may be stacked each other and have substantially the same thickness along the profile of the second interlayer insulating layer 150, in the areas overlapping the openings of the upper passivation layer PVX in a plan view. Thus, the first upper pad electrodes PD1 and the second upper pad electrodes PD2 may be bent in areas where the pad contact holes (CTP1 and CTP2) are formed through at least the second interlayer insulating layer 150, and may form single layers.

The second interlayer insulating layer 150 may have a bottom surface that is in direct contact with the top surfaces of the top connecting electrodes CNE, a top surface that is in direct contact with the first pads PAD1, and lateral sides that connect (or extend between) the top surface and the bottom surface and surround the pad contact holes CTP1 and CTP2. In some embodiments, an angle 01 formed by the bottom surface and the lateral sides of the second interlayer insulating layer 150 may be about 60° or less, but the disclosure is not limited thereto. When the angle θ1 is about 60° or less, the angle at which the first upper pad electrodes PD1 and the second upper pad electrodes PD2 are bent may become gentle. Thus, cracks can be prevented during the deposition of the first upper pad electrodes PD1 and the second upper pad electrodes PD2.

In some embodiments, the first pad contact holes CTP1 and the second pad contact holes CTP2 may have a square shape having a same width (i.e., a first width G1) in the first and second directions DR1 and DR2, but the disclosure is not limited thereto. In FIGS. 10 and 11, the first pad contact holes CTP1 and the second pad contact holes CTP2 have a square shape having the first width G1 in the first and second directions DR1 and DR2. The first width G1 may be defined as the distance between at least parts of the bottom surface of the second interlayer insulating layer 150 that are spaced apart from one another by the pad contact holes (CTP1 and CTP2). The first width G1 may be, for example, about 2.8 μm or greater. When the first width G1 is less than about 2.8 μm, bent parts of each of the first upper pad electrodes PD1 or each of the second upper pad electrodes PD2 may become too close to one another. Thus, cracks may become likely to occur. In the embodiment, the first width G1 may be set to about 2.8 μm or greater, and cracks may not be prevented.

In some embodiments, a distance G2 between the pad contact holes (CTP1 and CTP2) may be about 1.16 μm or less, but the disclosure is not limited thereto. In FIGS. 10 and 11, the distance G2 may be about 1.16 μm or less. The first pad contact holes CTP1 and the second pad contact holes CTP2, which have the first width G1, can be arranged on each of the top connecting electrodes CNE with a limited area.

Referring to FIG. 10, bottom surfaces of the third upper pad electrodes PD3 of the first pads PAD1 may be bent along the profile of the second upper pad electrodes PD2, which are bent along the pad contact holes (CTP1 and CTP2) in the second interlayer insulating layer 150, in the areas overlapping the openings of the upper passivation layer PVX in a plan view. Top surfaces of the third upper pad electrodes PD3 may be substantially flat in parallel to a plane formed by the first and second directions DR1 and DR2.

For example, the first layers PD3*a* of the third upper pad electrodes PD3 may be bent, having a substantially uniform thickness along the profile of the second upper pad electrodes PD2, which are bent along the pad contact holes (CTP1 and CTP2) in the second interlayer insulating layer 150. The second layers PD3*b* of the third upper pad electrodes PD3 may have a first thickness h1 in the third direction DR3 in areas not overlapping the pad contact holes (CTP1 and CTP2) and a second thickness h2, which is greater than the first thickness h1, in third direction DR3 in the areas overlapping the pad contact holes CTP1 and CTP2 in a plan view and may thus compensate for the step differences formed on the second upper pad electrodes PD2 by the pad contact holes (CTP1 and CTP2). The third layers PD3*c* of the third upper pad electrodes PD3 may be formed on the second layers PD3*b*, having a substantially flat profile. As the second layers PD3*b* of the third upper pad electrodes PD3 are deposited to be bent by the step differences formed on the second upper pad electrodes PD2 by the pad contact holes (CTP1 and CTP2) and to be in contact with the second upper pad electrodes PD2, the second layers PD3*b* of the third upper pad electrodes PD3 may compensate for the step differences formed on the second upper pad electrodes PD2 by the pad contact holes (CTP1 and CTP2).

As already mentioned above, as the top surfaces of the third upper pad electrodes PD3 are substantially flat in the areas overlapping the openings of the upper passivation layer PVX in a plan view, the fourth upper pad electrodes PD4 and the fifth upper pad electrodes PD5 may have a substantially uniform thickness without a step difference and a substantially flat profile in the areas overlapping the openings of the upper passivation layer PVX in a plan view. Accordingly, as the side wirings 200 and the fifth upper pad electrodes PD5 can be in contact with one another, having a substantially flat profile with almost no step differences, the contact between the first pads PAD1 and the side wirings 200 can be improved, and the contact resistance between the first pads PAD1 and the side wirings 200 can be lowered.

In case that step differences are formed on the fourth upper pad electrodes PAD4 and the fifth upper pad electrodes PADS in the areas overlapping the openings of the upper passivation layer PVX in a plan view, the electrical contact with the side wirings 200 may deteriorate, and the contact resistance with the side wirings 200 may increase. Also, the second layers PD4*b* of the fourth upper pad electrodes PD4 may be exposed due to the step differences formed by the pad contact holes CTP1 and CTP2. The second layers PD4*b* of the fourth upper pad electrodes PD4 may corrode due to moisture or foreign materials from the outside or due to galvanic corrosion, which promotes the corrosion of a metal having a relatively small standard reduction potential value when two dissimilar metals, e.g., Ag from the side wirings 200 and Al from the second layers PD4*b*, are in direct contact with each other, and as a result, the contact resistance between the second layers PD4*b* and the side wirings 200 may increase.

Thus, the contact between the first pads PAD1 and the side wirings 200 can be improved, and the contact resistance between the first pads PAD1 and the side wirings 200 can be lowered, by forming the fourth upper pad electrodes PD4 and the fifth upper pad electrodes PD5 have a uniform thickness with almost no step differences and have a flat profile in the areas overlapping with the openings of the upper passivation layer PVX.

The structure of a tiled display device TD including the display device 10 will hereinafter be described.

Figure 12:
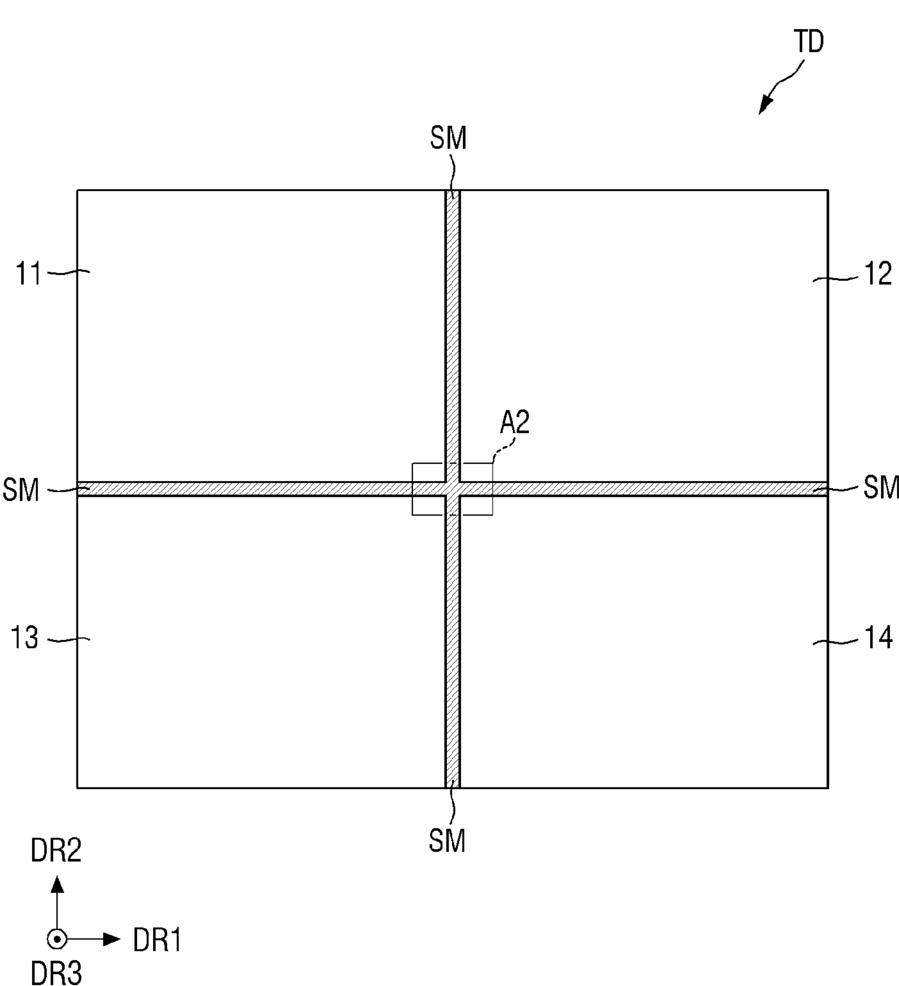
FIG. 12 is a schematic plan view of a tiled display device using the display device according to an embodiment of the disclosure.
Figure 13:
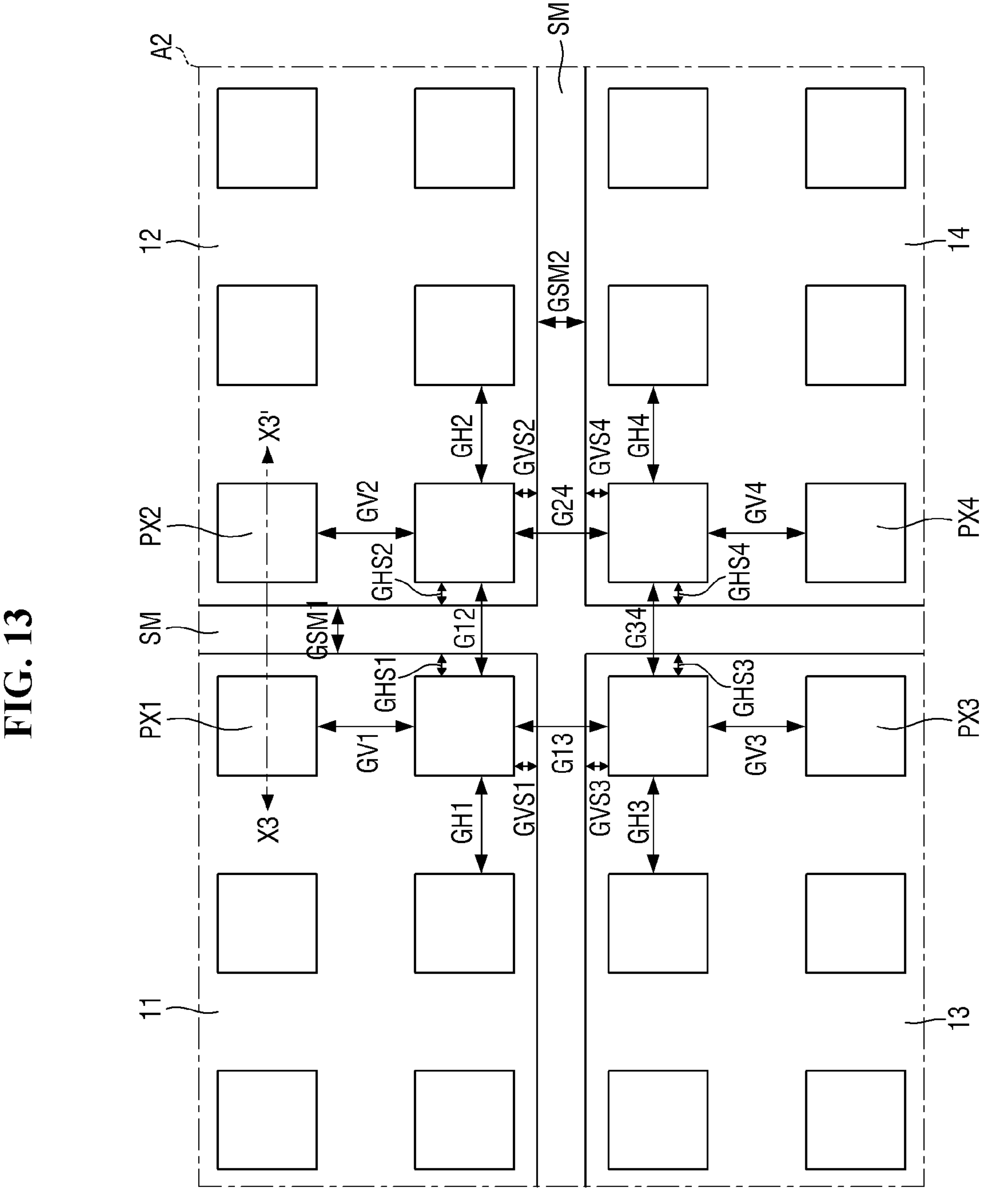
FIG. 13 is a schematic enlarged plan view of area A2 of FIG. 12.
Figure 14:
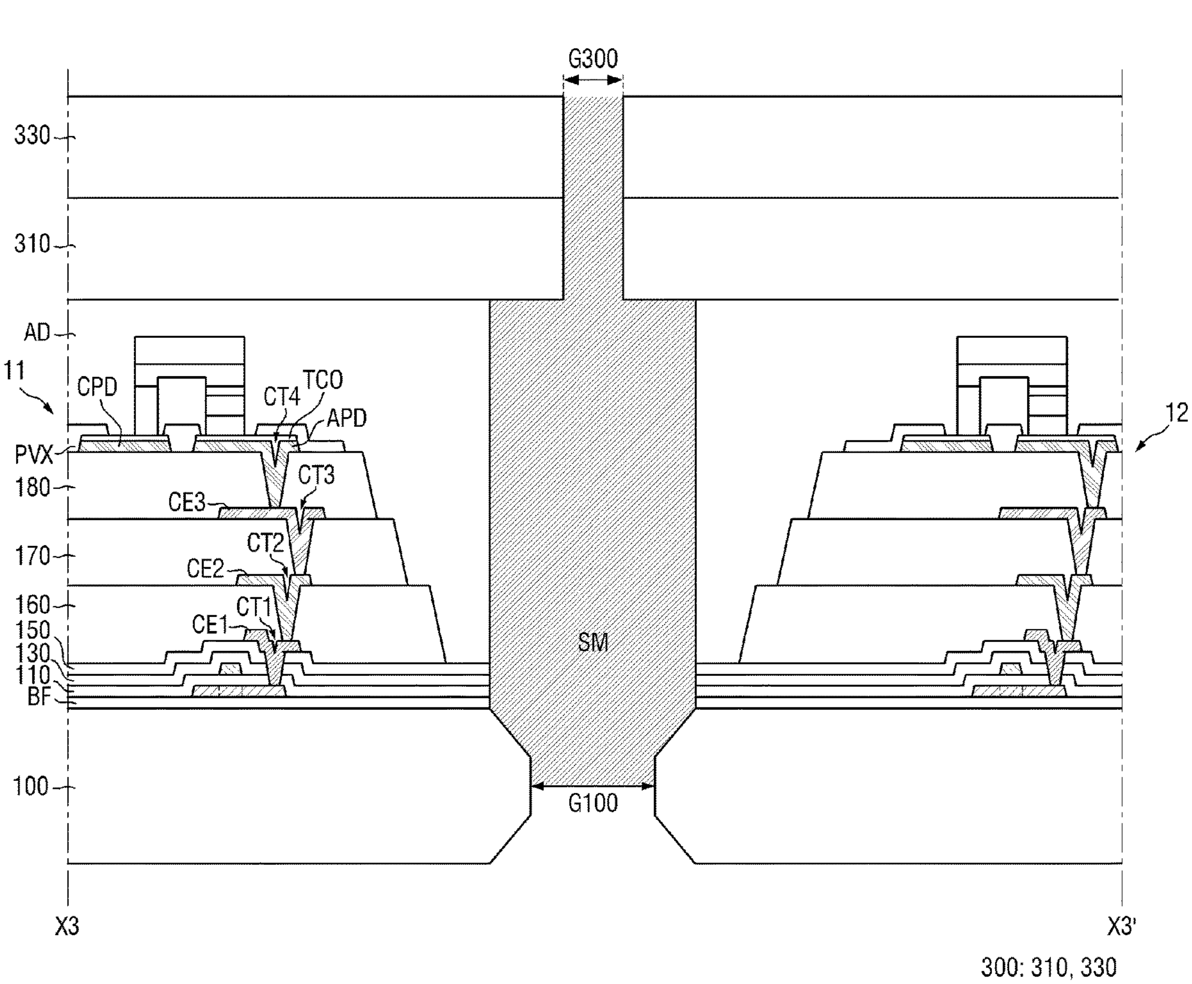
FIG. 14 is a schematic cross-sectional view taken along line X3-X3' of FIG. 13.

FIG. 12 is a schematic plan view of a tiled display device using the display device according to an embodiment of the disclosure. FIG. 13 is a schematic enlarged plan view of area A2 of FIG. 12. FIG. 14 is a schematic cross-sectional view taken along line X3-X3' of FIG. 13.

Referring to FIGS. 12 to 14, a tiled display device TD may include display devices a seam part SM, and front covers 300. For convenience of explanation, a display device in an upper left part of the tiled display device TD will hereinafter be referred to as a first display device 11, a display device 10 in an upper right part of the tiled display device TD will hereinafter be referred to as a second display device 12, a display device 10 in a lower left part of the tiled display device TD will hereinafter be referred to as a third display device 13, and a display device 10 in a lower right part of the tiled display device TD will hereinafter be referred to as a fourth display device 14. In FIG. 12, the tiled display device 10 includes four display devices 10, e.g., the first, second, third, and fourth display devices 11, 12, 13, and 14, but the number of display devices 10 included in the tiled display device TD is not limited thereto.

The first, second, third, and fourth display devices 11, 12, 13, and 14 may be arranged in a lattice form. The first, second, third, and fourth display devices 11, 12, 13, and 14 may be arranged in a matrix of M rows (where M is a positive integer) and N columns (where N is a positive integer). In FIG. 12, the first and second display devices 11 and 12 are adjacent to each other in a first direction DR1, the first and third display devices 11 and 13 are adjacent to each other in a second direction DR2, the third and fourth display devices 13 and 14 are adjacent to each other in the first direction DR1, and the second and fourth display devices 12 and 14 are adjacent to each other in the second direction DR2, but the layout of the first, second, third, and fourth display devices 11, 12, 13, and 14 in the tiled display device TD is not limited thereto. For example, the number and the layout of display devices 10 in the tiled display device TD may be determined based on the size and the shape of the tiled display device TD. For convenience of explanation, the tiled display device TD will hereinafter be described as including four display devices 10, e.g., the first, second, third, and fourth display devices 11, 12, 13, and 14, and the first, second, third, and fourth display devices 11, 12, 13, and 14 will hereinafter be described as being arranged in two rows and two columns.

The first, second, third, and fourth display devices 11, 12, 13, and 14 may have a same size, but the disclosure is not limited thereto. As another example, the first, second, third, and fourth display devices 11, 12, 13, and 14 may have different sizes.

The first, second, third, and fourth display devices 11, 12, 13, and 14 may have a rectangular shape having long sides and short sides. The first, second, third, and fourth display devices 11, 12, 13, and 14 may be arranged to have their long sides or short sides connected to one another. For example, a long side of the first display device 11 may be connected to a long side of the third display device 13, and a short side of the first device 11 may be connected to a short side of the second display device 12. A long side of the fourth display device 14 may be connected to a long side of the second display device 12, and a short side of the fourth display device 14 may be connected to a short side of the third display device 13. At least some of the first, second, third, and fourth display devices 11, 12, 13, and 14 may be disposed on edges of the tiled display device TD and may form one or more sides of the tiled display device TD. At least one of the first, second, third, and fourth display devices 11, 12, 13, and 14 may be disposed at at least one corner of the tiled display device TD and may form two adjacent sides of the tiled display device TD. At least one of the first, second, third, and fourth display devices 11, 12, 13, and 14 may be surrounded by others of the first, second, third, and fourth display devices 11, 12, 13, and 14. For example, the first display device 11 may be surrounded by the second, third, and fourth display devices 12, 13, and 14.

The first, second, third, and fourth display devices 11, 12, 13, and 14 may be substantially the same as the display device 10 of FIG. 1, and thus, detailed descriptions thereof are omitted.

The seam part SM may include a bonding member or an adhesive member. The first, second, third, and fourth display devices 11, 12, 13, and 14 may be connected to one another via the bonding member or the adhesive member of the seam part SM. The seam part SM may be disposed between the first and second display devices 11 and 12, between the first and third display devices 11 and 13, between the second and fourth display devices 12 and 14, and between the third and fourth display devices 13 and 14.

Referring to FIG. 13, the seam part SM may have a cross shape or a plus sign shape in the middle of the tiled display device TD where the first, second, third, and fourth display devices 11, 12, 13, and 14 are adjacent to one another.

The first display device 11 may include first pixels PX1, which are arranged in a matrix in a row direction (or a horizontal direction in FIG. 13) and a column direction (or a vertical direction in FIG. 13), to display an image. The second display device 12 may include second pixels PX2, which are arranged in a matrix in the row and column directions, to display an image. The third display device 13 may include third pixels PX3, which are arranged in a matrix in the row and column directions, to display an image. The fourth display device 14 may include fourth pixels PX4, which are arranged in a matrix in the row and column directions, to display an image. The first pixels PX1, the second pixels PX2, the third pixels PX3, and the fourth pixels PX4 may be substantially the same as the pixels PX of the display device 10 of FIG. 1, and thus, detailed descriptions thereof are omitted.

A minimum distance, in the first direction DR1, between the first pixels PX1 may be defined as a first horizontal distance GH1. A minimum distance, in the first direction DR1, between the second pixels PX2 may be defined as a second horizontal distance GH2. The first and second horizontal distances GH1 and GH2 may be substantially the same.

The seam part SM (e.g., at least part of the seam part SM) may be disposed between a column of first pixels PX1 and a column of second pixels PX2 that are adjacent to each other in the row direction. For example, the seam part SM (e.g., the at least part of the seam part SM) may be disposed between the first and second pixels PX1 and PX2 adjacent to each other, which are arranged in the column direction. A minimum distance G12 between the column of the first pixels PX1 and the column of the second pixels PX2 may be the sum of a minimum distance GHS1, in the row direction, between the column of first pixels PX1 and the seam part SM, a minimum distance GHS2, in the row direction, between the column of second pixels PX2 and the seam part SM, and a width GSM1, in the row direction, of the seam part SM.

The minimum distance G12, the first horizontal distance GH1, and the second horizontal distance GH2 may be substantially the same. To this end, the minimum distance GHS1 may be less than the first horizontal distance GH1, and the minimum distance GHS2 may be less than the second horizontal distance GH2. Also, the width GSM1 may be less than the first horizontal distance GH1 or the second horizontal distance GH2.

A minimum distance, in the row direction, between the third pixels PX3 may be defined as a third horizontal distance GH3. A minimum distance, in the row direction, between the fourth pixels PX4 may be defined as a fourth horizontal distance GH4. The third and fourth horizontal distances GH3 and GH4 may be substantially the same.

The seam part SM (e.g., at least part of the seam part SM) may be disposed between a column of third pixels PX3 and a column of fourth pixels PX4 that are adjacent to each other in the row direction. For example, the seam part SM (e.g., the at least part of the seam part SM) may be disposed between the third and fourth pixels PX3 and PX4 adjacent to each other, which are arranged in the column direction. A minimum distance G34 between the column of the third pixels PX3 and the column of the fourth pixels PX4 may be the sum of a minimum distance GHS3, in the row direction, between the column of third pixels PX3 and the seam part SM, a minimum distance GHS4, in the row direction, between the column of fourth pixels PX4 and the seam part SM, and the width GSM1, in the row direction, of the seam part SM.

The minimum distance G34, the third horizontal distance GH3, and the fourth horizontal distance GH4 may be substantially the same. To this end, the minimum distance GHS3 may be less than the third horizontal distance GH3, and the minimum distance GHS4 may be less than the fourth horizontal distance GH4. Also, the width GSM1 may be less than the third horizontal distance GH3 or the fourth horizontal distance GH4.

A minimum distance, in the column direction, between the first pixels PX1 may be defined as a first vertical distance GV1. A minimum distance, in the column direction, between the third pixels PX3 may be defined as a third vertical distance GV3. The first and third vertical distances GV1 and GV3 may be substantially the same.

The seam part SM (e.g., at least part of the seam part SM) may be disposed between a row of first pixels PX1 and a row of third pixels PX3 that are adjacent to each other in the column direction. For example, the seam part SM (e.g., the at least part of the seam part SM) may be disposed between the first and third pixels PX1 and PX3 adjacent to each other, which are arranged in the row direction. A minimum distance G13 between the row of the first pixels PX1 and the row of third pixels PX3 may be the sum of a minimum distance GVS1, in the column direction, between the row of first pixels PX1 and the seam part SM, a minimum distance GVS3, in the column direction, between the row of third pixels PX3 and the seam part SM, and a width GSM2, in the column direction, of the seam part SM.

The minimum distance G13, the first vertical distance GV1, and the third vertical distance GV3 may be substantially the same. To this end, the minimum distance GVS1 may be less than the first vertical distance GV1, and the minimum distance GVS3 may be less than the third vertical distance GV3. Also, the width GSM2 may be less than the first vertical distance GV1 or the third vertical distance GV3.

A minimum distance, in the column direction, between the second pixels PX2 may be defined as a second vertical distance GV2. A minimum distance, in the column direction, between the fourth pixels PX4 may be defined as a fourth vertical distance GV4. The second and fourth vertical distances GV2 and GV4 may be substantially the same.

The seam part SM (e.g., at least part of the seam part SM) may be disposed between a row of second pixels PX2 and a row of fourth pixels PX4 that are adjacent to each other in the column direction. For example, the seam part SM (e.g., the at least part of the seam part SM) may be disposed between the first and fourth pixels PX1 and PX4 adjacent to each other, which are arranged in the row direction. A minimum distance G24 between the row of the second pixels PX2 and the row of the fourth pixels PX4 may be the sum of a minimum distance GVS2, in the column direction, between the row of second pixels PX2 and the seam part SM, a minimum distance GVS4, in the column direction, between the row of fourth pixels PX4 and the seam part SM, and a width GSM4, in the column direction, of the seam part SM.

The minimum distance G24, the second vertical distance GV2, and the fourth vertical distance GV4 may be substantially the same. To this end, the minimum distance GVS2 may be less than the second vertical distance GV2, and the minimum distance GVS4 may be less than the fourth vertical distance GV4. Also, the width GSM4 may be less than the second vertical distance GV2 or the fourth vertical distance GV4.

In order to prevent the seam part SM from becoming visible between images displayed by the first, second, third, and fourth display devices 11, 12, 13, and 14, the minimum distance between the pixels PX may be configured to be substantially the same not only in each of the first, second, third, and fourth display devices 11, 12, 13, and 14, but also between the first, second, third, and fourth display devices 11, 12, 13, and 14, as illustrated in FIG. 13.

Referring to FIG. 14, front covers 300 may be disposed on the first, second, third, and fourth display devices 11, 12, 13, and 14. For convenience of explanation, a front cover of the front covers 300 on the first display device 11 will hereinafter be referred to as a first front cover, a front cover of the front covers 300 on the second display device 12 will hereinafter be referred to as a second front cover, a front cover of the front covers 300 on the third display device 13 will hereinafter be referred to as a third front cover, and a front cover of the front covers 300 on the fourth display device 14 will hereinafter be referred to as a fourth front cover. The front covers 300, which correspond to the first, second, third, and fourth display devices 11, 12, 13, and 14, may be bonded to one another via adhesive members AD. FIG. 14 illustrates the layout of the first and second display devices 11 and 12 and the first and second front covers 300, which correspond to the first and second display devices 11 and 12, respectively. The layout of the third and fourth display devices 13 and 14 and the third and fourth front covers 300 may be substantially the same as the layout of the first and second display devices 11 and 12 and the first and second front covers 300. Thus, a detailed description thereof is omitted.

The first front cover 300 may be disposed on the first display device 11 and may protrude beyond a substrate 100 of the first display device 11. Thus, a gap G100 between the substrate 100 of the first display device 11 and a substrate 100 of the second display device 12 may be wider than a gap G300 between the first and second front covers 300.

Each of the front covers 300 may include a light transmittance control layer 310 and an antiglare layer 320.

As already mentioned above, the front covers 300 may be attached to their respective display devices 10 via the adhesive members AD. The adhesive members AD may be transparent adhesive members capable of transmitting light therethrough. For example, the adhesive members AD may be optically clear adhesive films or optically clear resins.

Light transmittance control layers 310 may be disposed on the adhesive members AD. The light transmittance control layers 310 may be designed to lower the transmittance of external light or light reflected from the first and second display devices 11 and 12. As the first and second front covers 300 protrude beyond the substrates 100 of the first and second display devices 11 and 12, the light transmittance control layers 310 of the first and second front covers 300 may also protrude beyond the substrates 100 of the first and second display devices 11 and 12. Accordingly, the gap G100 between the substrates 100 of the first and second display devices 11 and 12 can be prevented from becoming visible from the outside.

Antiglare layers 320 may be disposed on the light transmittance control layers 310. The antiglare layers 320 may be designed to diffusely reflect external light to prevent the visibility of images from being degraded by the reflection of external light. The antiglare layers 320 may increase the contrast ratio of images displayed by the first and second display devices 11 and 12.

The antiglare layers 320 may be implemented as polarizing plates, and the light transmittance control layers 310 may be implemented as phase delay layers. However, the disclosure is not limited to this.

It will hereinafter be described how to drive the tiled display device TD.

Figure 15:
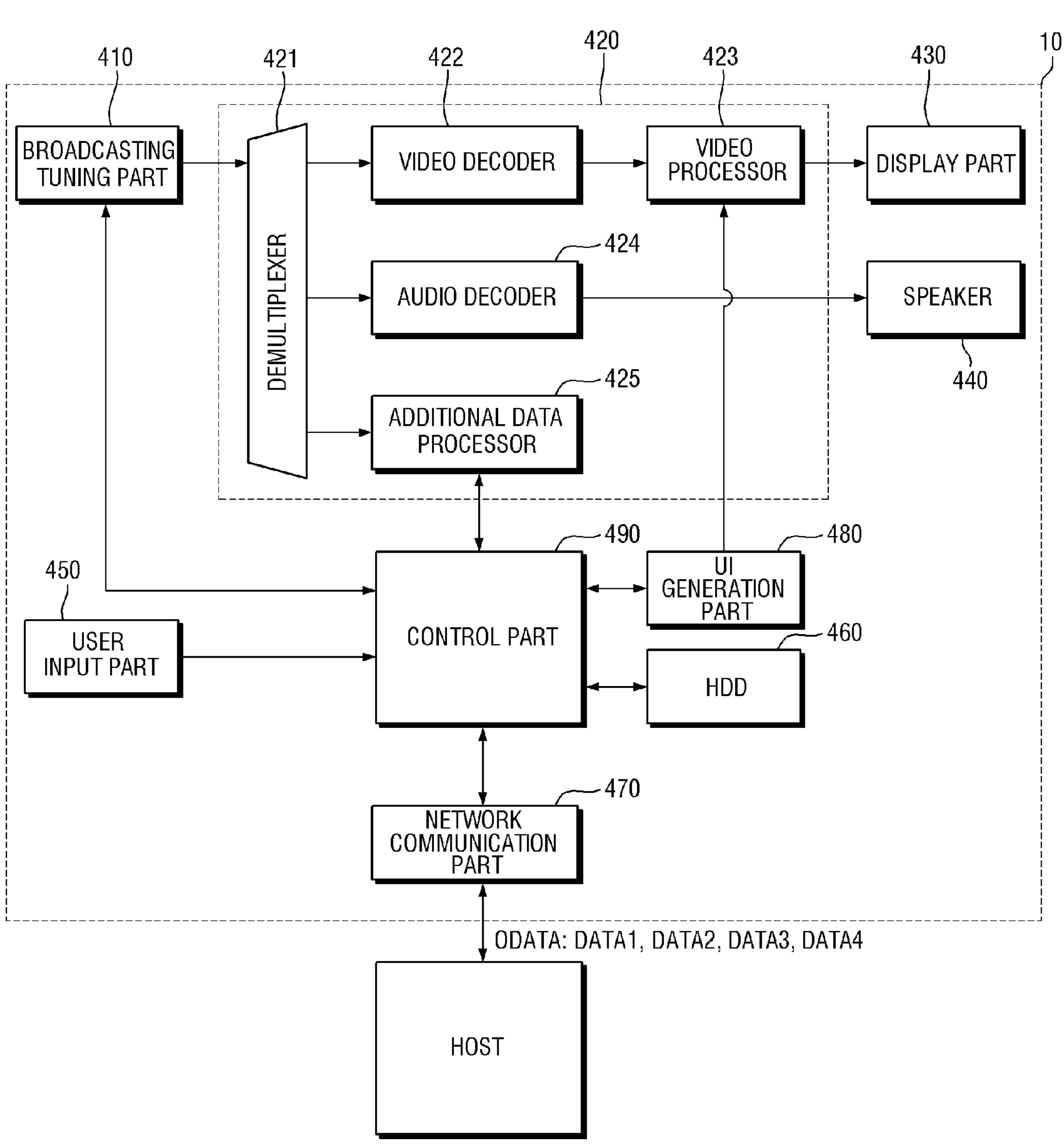
FIG. 15 is a schematic block diagram of the display device according to an embodiment of the disclosure.
Figure 16:
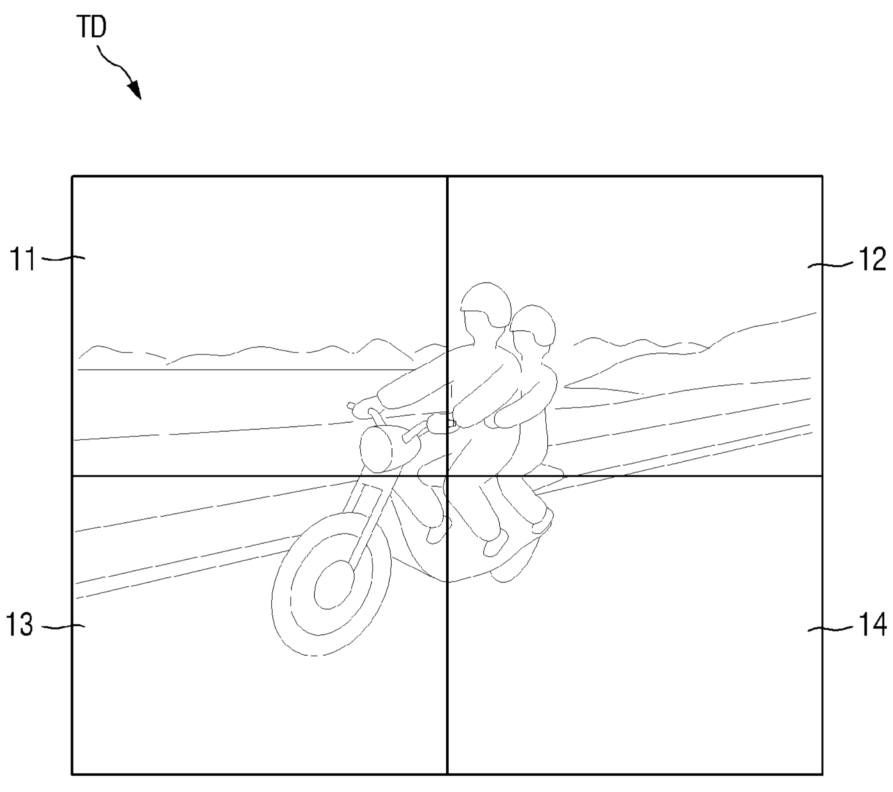
FIG. 16 is a schematic plan view illustrating how the tiled display device is driven.

FIG. 15 is a schematic block diagram of the display device according to an embodiment of the disclosure. FIG. 16 is a schematic plan view illustrating how the tiled display device is driven.

Referring to FIGS. 15 and 16, the tiled display device TD may include a host system HOST and display devices 10. Each of the display devices 10 may include a broadcasting tuning part 410, a signal processing part 420, a display part 430, a speaker 440, a user input part 450, a hard disk drive (HDD) 460, a network communication part 470, a user interface (UI) generation part 480, and a control part 490. FIG. 15 illustrates the host system HOST and the display device 10 (e.g., the first display device 11).

The host system HOST may be implemented as a TV system, a home theater system, a set-top box, a navigation system, a digital versatile disc (DVD) player, a Blu-ray player, a PC, a mobile phone system, or a tablet PC.

Commands from a user may be input to the host system HOST in various formats. For example, the host system HOST may receive commands by touch input from the user. In other embodiments, the host system HOST may receive commands by keyboard input or button input from a remote control.

The host system HOST may receive original video data ODATA corresponding to an original image from the outside. The host system HOST may divide the original video data ODATA into as many video data as the number of the display devices 10 in the tiled display device TD. For example, the host system HOST may divide the original video data ODATA into first video data DATA1 corresponding to a first image, second video data DATA2 corresponding to a second image, third video data DATA3 corresponding to a third image, and fourth video data DATA4 corresponding to a fourth image. The host system HOST may transmit the first video data DATA1, the second video data DATA2, the third video data DATA3, and the fourth video data DATA4 to the first, second, third, and fourth display devices 11, 12, 13, and 14, respectively.

The first display device 11 may display the first image based on the first video data DATA1, the second display device 12 may display the second image based on the second video data DATA2, the third display device 13 may display the third image based on the third video data DATA3, and the fourth display device 14 may display the fourth image based on the fourth video data DATA4. Accordingly, the user may view an original image into which the first, second, third, and fourth images displayed by the first, second, third, and fourth display devices 11, 12, 13, and 14, respectively, are combined.

Each of the first, second, third, and fourth display devices 11, 12, 13, and 14 of the tiled display device TD may include the broadcasting tuning part 410, the signal processing part 420, the display part 430, the speaker 440, the user input part 450, the HDD 460, the network communication part 470, the UI generation part 480, and the control part 490. The first, second, third, and fourth display devices 11, 12, 13, and 14 may have substantially a same structure. Thus, the structure of the first display device 11 will hereinafter be described, and descriptions of the structures of the second, third, and fourth display devices 12, 13, and 14 are omitted.

The broadcasting tuning part 410 may be tuned to a frequency of a channel (e.g., a predetermined or selectable channel) under the control of the control part 490 and may receive a broadcast signal from the channel via an antenna. The broadcasting tuning part 410 may include a channel detection module and a radio frequency (RF) demodulation module.

A broadcast signal demodulated by the broadcasting tuning part 410 may be processed by the signal processing part 420 and may be output via the display part 430 and the speaker 440. The signal processing part 420 may include a demultiplexer 421, a video decoder 422, a video processor 423, an audio decoder 424, and an additional data processor 425.

The demultiplexer 421 may demultiplex the demodulated broadcast signal into a video signal, an audio signal, and additional data. The video signal, the audio signal, and the additional data may be restored by the video decoder 422, the audio decoder 424, and the additional data processor 425, respectively. The video decoder 422, the audio decoder 424, and the additional data processor 425 may restore (or decode) the video signal, the audio signal, and the additional data, respectively, into a decoding format corresponding to an encoding format of the received broadcast signal.

The decoded video signal may be converted by the video processor 423 to meet the output standard of the display part 430 in terms of vertical frequency, resolution, and aspect ratio. The decoded audio signal may be output via the speaker 440.

The display part 430, which is a device for displaying an image, may include pixels PX and a driving part.

The user input part 450 may receive signals transmitted by the host system HOST. The user input part 450 may be provided to enter not only data regarding a selection of a channel transmitted by the host system HOST or a selection and manipulation of a UI menu, but also data regarding a command selected or input by the user for communication with the second, third, and fourth display devices 12, 13, and 14.

The HDD 460, which stores various software programs, including an operating system (OS) program, recorded broadcast programs, moving videos, pictures, and other data, may be implemented as a storage medium such as a hard disk or a nonvolatile memory.

The network communication part 470, which is for short-distance communication with the host system HOST and the second, third, and fourth display devices 12, 13, and 14, may be implemented as a communication module including an antenna pattern capable of realizing mobile communication, data communication, Bluetooth, RF, Ethernet, or the like.

The network communication part 470 may transmit or receive wireless signals, via the antenna pattern, over a communication network established in accordance with a mobile communication standard or method such as, for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), or 5G.

The network communication part 470 may also transmit or receive wireless signals, via the antenna pattern, over a communication network established in accordance with wireless Internet technology. Examples of the wireless Internet technology may include Wireless Local Area Network (WLAN), Wireless-Fidelity (WiFi), Wireless-Fidelity Direct (WiFi Direct), Digital Living Network Alliance (DLNA), Wireless Broadband (WiBro), World Interoperability for Microwave Access (WiMAX), HSDPA, HSUPA, LTE, LTE-A, and the like. The antenna pattern may transmit or receive data in accordance with at least one wireless Internet technique.

The UI generation part 480, which is for creating a UI menu for communication with the host system HOST and the second, third, and fourth display devices 12, 13, and 14, may be implemented by algorithm code and an on-screen display (OSD) integrated circuit (IC). The UI menu for communication with the host system HOST and the second, third, and fourth display devices 12, 13, and 14 may be a menu for designating a desired counterpart digital TV and choosing a desired function.

The control part 490, which generally controls the first display device 11 and controls communication with the host system HOST and with the second, third, and fourth display devices 12, 13, and 14, may have algorithm code stored therein and may be implemented by a micro-controller part (MCU) where the algorithm code is run (or operated).

The control part 490 may receive input and selection from the user input part 450, and control transmission of control commands and data to the host system HOST and the second, third, and fourth display devices 12, 13, and 14 via the network communication part 470. In response to a control command and data being received from the host system HOST and the second, third, and fourth display devices 12, 13, and 14, the control part 490 may perform an operation in accordance with the predetermined control command.

Detailed description of display devices according to other embodiments of the disclosure will hereinafter be described. Like reference numerals denote like elements throughout the disclosure, and thus, detailed descriptions thereof are omitted.

Figure 17:
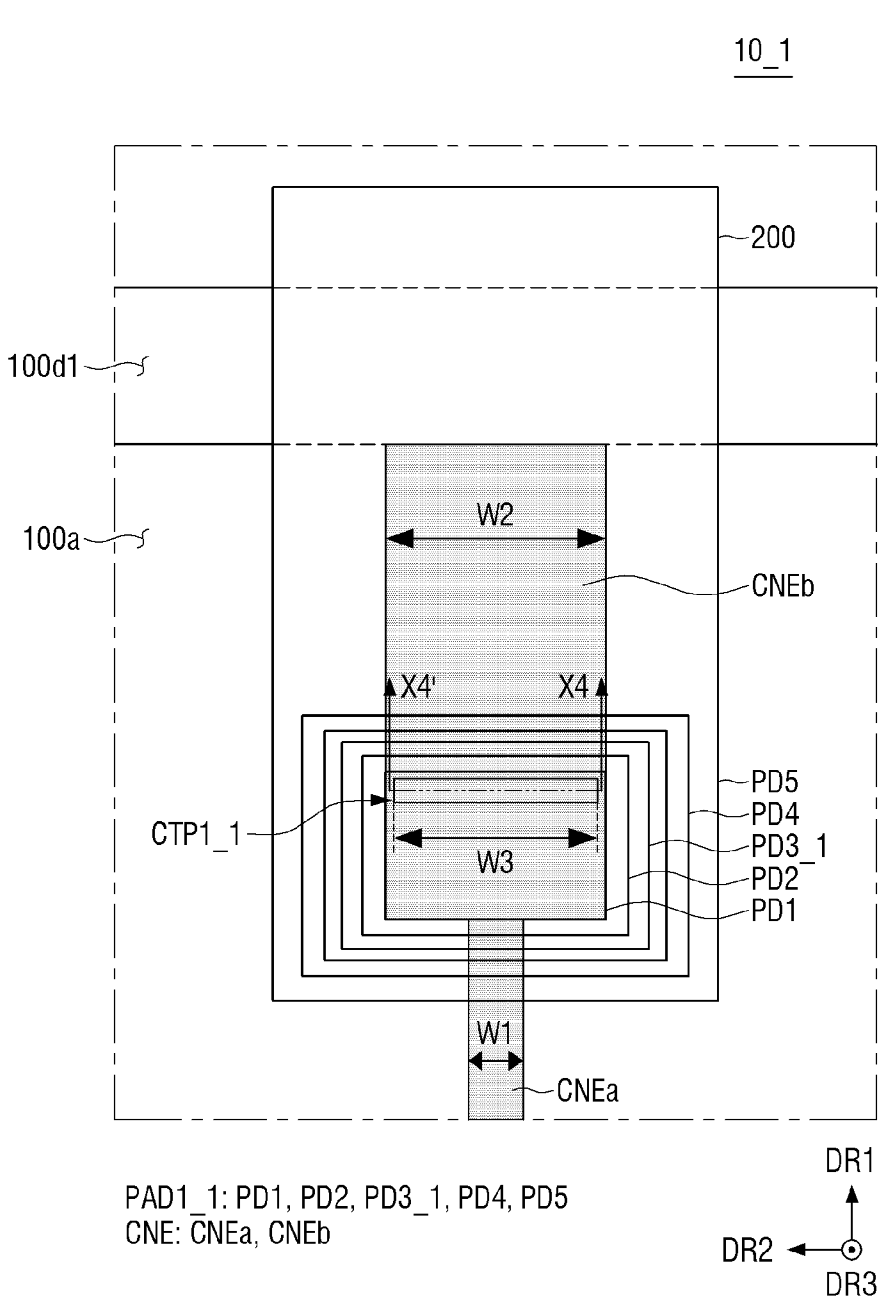
FIG. 17 is a schematic plan view illustrating a first pad and a pad contact hole of a display device according to another embodiment of the disclosure.
Figure 18:
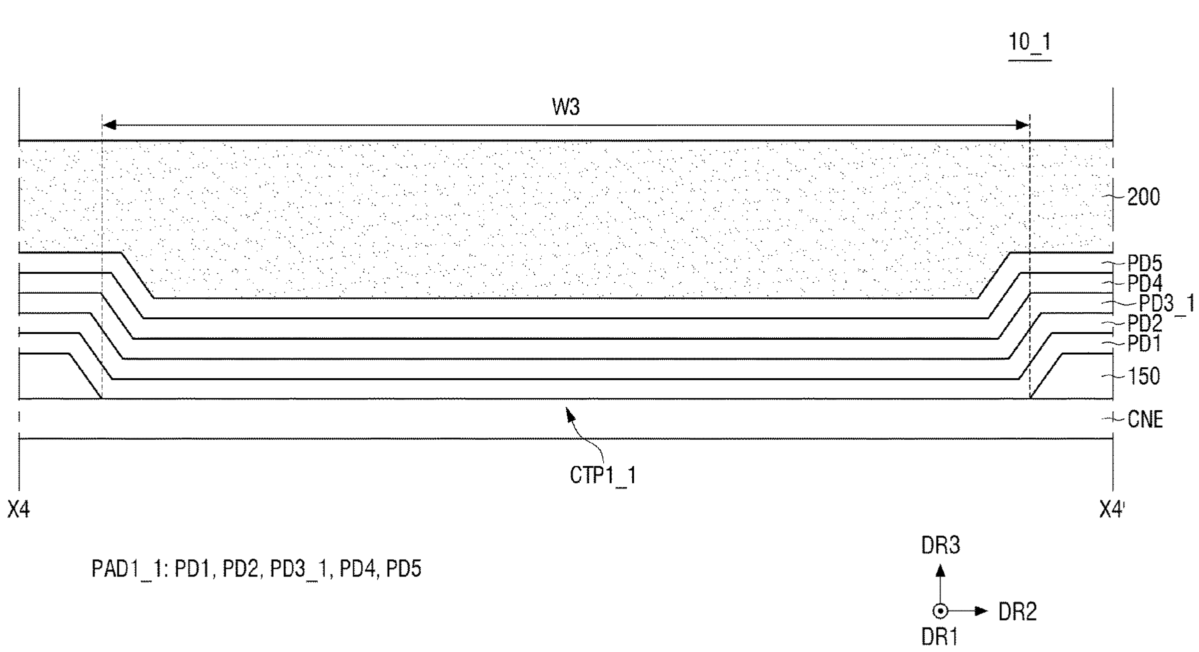
FIG. 18 is a schematic cross-sectional view taken along line X4-X4' of FIG. 17.

FIG. 17 is a schematic plan view illustrating a first pad and a pad contact hole of a display device according to another embodiment of the disclosure. FIG. 18 is a schematic cross-sectional view taken along line X4-X4' of FIG. 17.

Referring to FIGS. 17 and 18, a display device 10_1 may include a pad contact hole CTP1_1, which extends in a second direction DR2. For example, the pad contact hole CTP1_1 may have a rectangular shape having short sides extending in a first direction DR1 and long sides extending in the second direction DR2, in a plan view.

As mentioned above, a top connecting electrode CNE may include a wiring portion CNEa electrically connected to pixels PX in a display area DA and a contact portion CNEb electrically connected to a first pad PAD1. The wiring portion CNEa may extend in the first direction DR1, having a first width W1 in the second direction DR2. The contact portion CNEb may extend in the first direction DR1, having a second width W2, which is greater than the first width W1, in the second direction DR2.

The pad contact hole CTP1_1 may have a third width W3, which is greater than the first width W1 and less than the second width W2, in the second direction DR2. The first pad PAD1_1 may include first, second, third, fourth, and fifth upper pad electrodes PD1, PD2, PD3_1, PD4, and PD5 and may be in direct contact with the top connecting electrode CNE through the pad contact hole CTP1_1.

As the pad contact hole CTP1_1 extends in the second direction DR2 by as much as the third width W3, the first upper pad electrode PD1 of the first pad PAD1_1 may have an enlarged area of contact with the top connecting electrode CNE and may have a substantially uniform thickness and a substantially flat profile in an area overlapping a side wiring 200 in a plan view, as illustrated in FIG. 8. For example, the contact area between the first upper pad electrode PAD1 of the first pad PAD1_1 and the top connecting electrode CNE may be increased, and the overlapping area between the first upper pad electrode PD1 and the side wiring 200 in a plan view may have the substantially flat profile. Accordingly, the second, third, and fourth upper pad electrodes PD2, PD3_1, and PD4 may also have a substantially uniform thickness and a substantially flat profile in an area of contact between the fifth upper pad electrode PD5 and the side wiring 200. For example, the third upper pad electrode PD3_1 of the first pad PAD1_1, unlike the third upper pad electrode PD3 of the display device 10 (e.g., refer to FIG. 7), may have a substantially uniform thickness and a substantially flat profile in the area of contact between the fifth upper pad electrode PD5 and the side wiring 200.

Therefore, as the fifth upper pad electrode PD5 and the side wiring 200 are in contact with each other, having a substantially flat profile with almost no step differences, the electrical contact between the first pad PAD1_1 and the side wiring 200 can be improved, and the contact resistance between the first pad PAD1_1 and the side wirings 200 can be lowered.

Figure 19:
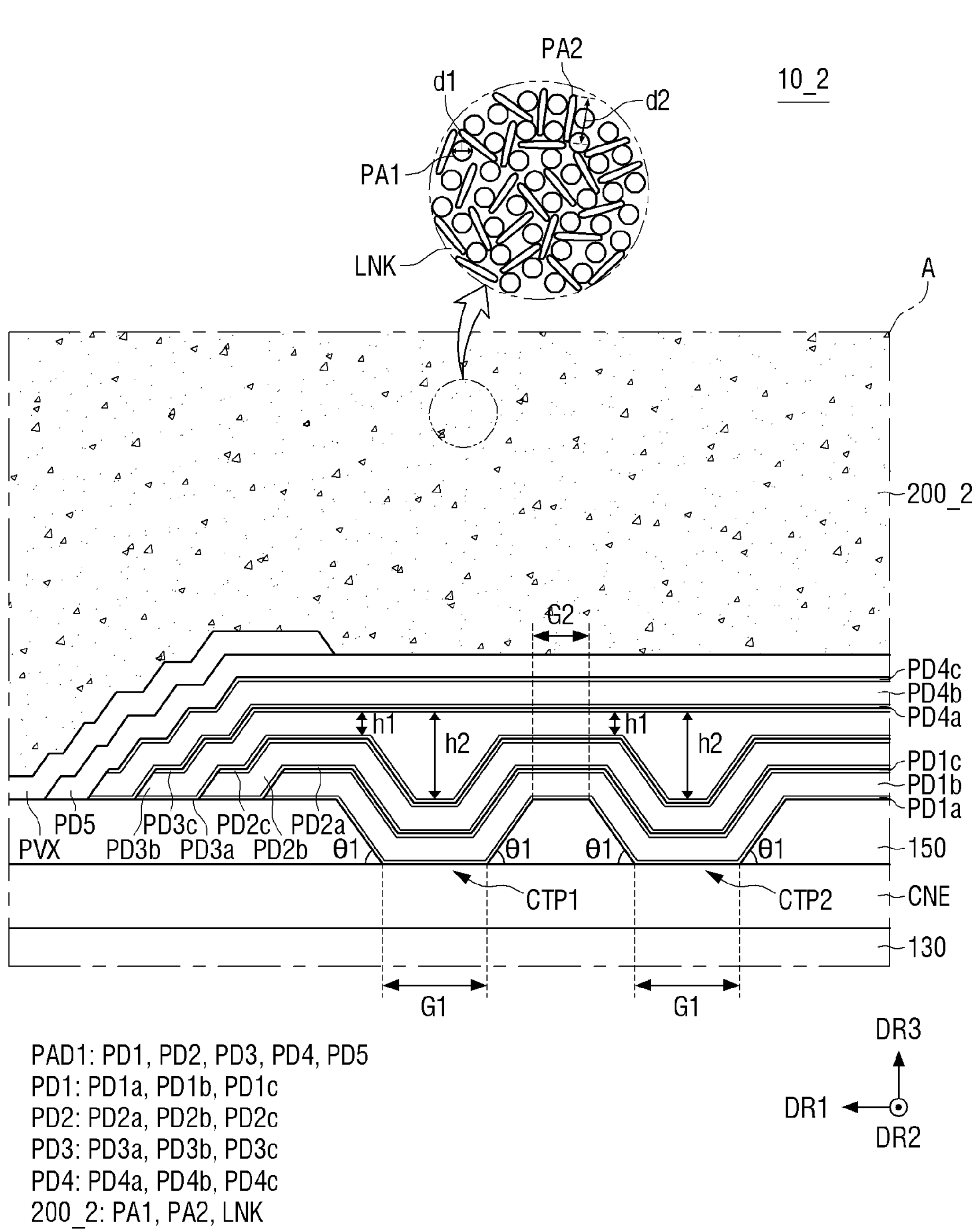
FIG. 19 is a schematic cross-sectional view illustrating particles that form side wirings of a display device according to another embodiment of the disclosure.

FIG. 19 is a schematic cross-sectional view illustrating particles that form side wirings of a display device according to another embodiment of the disclosure.

Referring to FIG. 19, a side wiring 200_2 of a display device 10_2 may further include second particles PA2, which have a different shape from first particles PAL The second particles PA2 may have a rod shape extending in a direction. For example, the second particles PA2 may have the rod shape extending in the direction and be arranged in various directions (or random directions).

The side wiring 200_2 may consist of a crosslinking member LNK, the first particles PA1, and the second particles PA2. The first particles PA1 and the second particles PA2 may be dispersed in the crosslinking member LNK. The second particles PA2, like the first particles PA1, may include particles of a metal such as Ag or Cu. The first particles PA1 and the second particles PA2 may be formed separately by different fabricating processes and may then be mixed together to form the side wiring 200_2. For example, temperature and time conditions for forming the first particles PA1 may differ from temperature and time conditions for forming the second particles PA2.

The second particles PA2 may generally have a rod shape extending in a direction. For example, the second particles PA2 may have a cylindrical shape or a cylinder-like shape. In a plan view, each of the second particles PA2 may have short sides and long sides, a length of the short sides may be less than a first diameter dl of the first particles PA1, and a length d2 of the long sides may be greater than the first diameter d1. In some embodiments, the length d2 of the long sides of the first particles PA1 may be in a range of about 1 μm to about 3 μm, but the disclosure is not limited thereto.

As the second particles PA2 can be placed between the first particles PA1, a density of metal particles (e.g., the first particles PA1 and the second particles PA2) dispersed in the crosslinking member LNK of the side wiring 200_2 can be raised.

Accordingly, the electrical contact between a first pad PAD1 with the side wiring 200_2 can be improved, and the contact resistance between the first pad PAD1 and the side wiring 200_2 can be lowered.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a substrate having:

a first surface in which a light-emitting element is disposed;

a second surface that is opposite to the first surface; and a first lateral side that extends between the first and second surfaces;

a connecting electrode disposed on the first surface of the substrate and electrically connected to the light-emitting element;

a first insulating layer disposed on the connecting electrode and including a contact hole exposing the connecting electrode;

a first upper pad electrode disposed on the first insulating layer and electrically connected to the connecting electrode, the first upper pad electrode having:

a first thickness in an area not overlapping the contact hole in a plan view; and a second thickness, which is greater than the first thickness, in an area overlapping the contact hole in the plan view;

a second upper pad electrode disposed on the first upper pad electrode and having a substantially flat profile;

a lower pad disposed on the second surface of the substrate; and a side wiring disposed on the second upper pad electrode and electrically connecting the second upper pad electrode and the lower pad, the side wiring surrounding the first surface, the first lateral side, and the second surface of the substrate.

2. The display device of claim 1, wherein the first upper pad electrode includes:

a first layer;

a second layer; and a third layer, the first, second, and third layers of the first upper pad electrode are sequentially stacked, the first layer of the first upper pad electrode has a substantially uniform thickness and a profile bent along the contact hole, the third layer of the first upper pad electrode has a substantially uniform thickness and has a substantially flat profile, and the second layer of the first upper pad electrode is thicker in an area overlapping the contact hole in a plan view than in the area not overlapping the contact hole in the plan view.

3. The display device of claim 2, wherein the first and third layers of the first upper pad electrode include titanium (Ti), and the second layer of the first upper pad electrode includes aluminum (Al).

4. The display device of claim 3, further comprising:

a third upper pad electrode disposed between the second upper pad electrode and the side wiring and having a substantially flat profile, wherein the third upper pad electrode includes a transparent conductive oxide and is in direct contact with the side wiring.

5. The display device of claim 4, wherein the second upper pad electrode includes:

a first layer;

a second layer; and a third layer, the first, second, and third layers of the second upper pad electrode are sequentially stacked, the first and third layers of the second upper pad electrode include Ti, the second layer of the second upper pad electrode includes Al, and the first, second, and third layers of the second upper pad electrode have a substantially uniform thickness and a substantially flat profile.

6. The display device of claim 1, wherein the first insulating layer has:

a bottom surface that is in direct contact with the connecting electrode;

a top surface that is opposite to the bottom surface of the first insulating layer; and lateral sides that extend between the top surface and the bottom surface of the first insulating layer and surround the contact hole, and an angle formed by the bottom surface and the lateral sides of the first insulating layer is about 60° or less.

7. The display device of claim 1, wherein the light-emitting element is a flip chip-type micro-light-emitting diode.

8. A display device comprising:

a substrate having:

a first surface in which a light-emitting element is disposed;

a second surface that is opposite to the first surface;

a first chamfered surface that extends from a side of the first surface;

a second chamfered surface that extends from a side of the second surface; and a first lateral side that extends between the first and second chamfered surfaces;

a connecting electrode disposed on the first surface of the substrate and electrically connected to the light-emitting element;

a first insulating layer disposed on the connecting electrode and including a contact hole exposing the connecting electrode; and a first pad disposed on the first insulating layer and electrically connected to the connecting electrode through the contact hole, wherein the connecting electrode includes:

a wiring portion electrically connected to the light-emitting element and having a first width in a first direction; and a contact portion overlapping the contact hole in a plan view, being in contact with the first pad, and having a second width, greater than the first width, in the first direction, and the contact hole has a third width, greater than the first width, and less than the second width, in the first direction.

9. The display device of claim 8, wherein the wiring portion and the contact portion extend in a second direction, which intersects the first direction, and the contact hole extends in the first direction.

10. The display device of claim 9, wherein the contact portion extends over the first surface to adjacent to a boundary between the first surface and the first chamfered surface.

11. The display device of claim 10, further comprising:

a second pad disposed on the second surface of the substrate; and a side wiring disposed on the first pad and electrically connecting the first and second pads, the side wiring surrounding the first surface, the first chamfered surface, the first lateral side, the second chamfered surface, and the second surface of the substrate.

12. A display device comprising:

a substrate having:

a first surface in which a light-emitting element is disposed;

a second surface that is opposite to the first surface; and a first lateral side that extends between the first and second surfaces;

a connecting electrode disposed on the first surface of the substrate and electrically connected to the light-emitting element;

a first insulating layer disposed on the connecting electrode and including a contact hole exposing the connecting electrode;

a first pad disposed on the first insulating layer and electrically connected to the connecting electrode through the contact hole;

a second pad disposed on the second surface of the substrate; and a side wiring disposed on the first pad and electrically connecting the first and second pads, the side wiring surrounding the first surface, the first lateral side, and the second surface of the substrate, wherein the side wiring includes:

a plurality of first particles having a substantially spherical shape or a sphere-like shape; and a plurality of second particles having a substantially rod shape or a rod-like shape and disposed between the first particles.

13. The display device of claim 12, wherein the plurality of first particles have a diameter in a range of about 0.1 μm to about 0.3 μm, and the plurality of second particles have a length in a range of about 1 μm to about 3 μm.

14. The display device of claim 13, further comprising:

an overcoat layer surrounding the side wiring, wherein the side wiring includes a metal, and the overcoat layer includes an organic insulating material.

15. The display device of claim 14, wherein the plurality of first particles and the plurality of second particles include silver (Ag).

16. A tiled display device comprising:

a plurality of display devices; and a seam part disposed between the plurality of display devices, wherein a first display device of the plurality of display devices, includes:

a substrate having:

a first surface in which a light-emitting element is disposed;

a second surface that is opposite to the first surface;

a first chamfered surface that extends from a side of the first surface;

a second chamfered surface that extends from a side of the second surface; and a first lateral side that extends between the first and second chamfered surfaces;

a top connecting electrode disposed on the first surface of the substrate and electrically connected to the light-emitting element;

a first insulating layer disposed on the top connecting electrode and including a contact hole exposing the top connecting electrode;

a first upper pad electrode disposed on the first insulating layer, electrically connected to the top connecting electrode, and having:

a first thickness in an area not overlapping the contact hole in a plan view; and a second thickness, which is greater than the first thickness, in an area overlapping the contact hole in the plan view;

a second upper pad electrode disposed on the first upper pad electrode and having a substantially flat profile;

a lower pad disposed on the second surface of the substrate; and a side wiring disposed on the second upper pad electrode and electrically connecting the second upper pad electrode and the lower pad, the side wiring surrounding the first surface, the first chamfered surface, the first lateral side, the second chamfered surface, and the second surface of the substrate.

17. The tiled display device of claim 16, wherein the light-emitting element is a flip chip-type micro-light-emitting diode.

18. The tiled display device of claim 16, wherein the substrate is formed of glass.

19. The tiled display device of claim 16, wherein the first display device further includes:

a bottom connecting electrode disposed on the second surface of the substrate; and a flexible film electrically connected to the bottom connecting electrode through a conductive adhesive member, and the lower pad and the bottom connecting electrode are electrically connected to each other.

20. The tiled display device of claim 16, wherein the plurality of display devices are arranged in a matrix of M rows and N columns.

* * * * *